United States Patent [19]

Sasaki et al.

[11] Patent Number: 5,775,980
[45] Date of Patent: Jul. 7, 1998

[54] POLISHING METHOD AND POLISHING APPARATUS

[75] Inventors: Yasutaka Sasaki; Mie Matsuo, both of Yokohama; Rempei Nakata, Kawasaki; Junichi Wada, Yokohama; Nobuo Hayasaka, Yokosuka, all of Japan; Hiroyuki Yano, Wappingers Falls, N.Y.; Haruo Okano, Tokyo, Japan

[73] Assignee: Kabushiki Kaisha Toshiba, Kawasaki, Japan

[21] Appl. No.: 743,044

[22] Filed: Nov. 4, 1996

Related U.S. Application Data

[60] Division of Ser. No. 300,127, Sep. 2, 1994, Pat. No. 5,607,718, which is a continuation-in-part of Ser. No. 217,642, Mar. 25, 1994, abandoned.

[30] Foreign Application Priority Data

| Mar. 26, 1993 | [JP] | Japan | 5-068906 |
| Sep. 17, 1993 | [JP] | Japan | 5-231283 |
| Sep. 17, 1993 | [JP] | Japan | 5-231284 |
| Nov. 16, 1993 | [JP] | Japan | 5-286988 |
| Mar. 15, 1994 | [JP] | Japan | 6-044160 |
| Mar. 15, 1994 | [JP] | Japan | 6-044316 |

[51] Int. Cl.$^6$ ................................ B24B 5/00
[52] U.S. Cl. ............... 451/285; 451/286; 451/287; 451/288; 451/289; 451/7; 451/53; 451/60; 451/488
[58] Field of Search ................ 451/285–290, 451/56, 41, 53, 5, 7, 488, 60, 446

[56] References Cited

U.S. PATENT DOCUMENTS

| 4,450,652 | 5/1984 | Walsh | 451/7 |
| 4,513,894 | 4/1985 | Doyle et al. | 451/446 |
| 5,127,196 | 7/1992 | Morimoto et al. | 451/7 |

FOREIGN PATENT DOCUMENTS

| 401199762 | 8/1989 | Japan | 451/7 |

*Primary Examiner*—Robert A. Rose
*Assistant Examiner*—George Nguyen
*Attorney, Agent, or Firm*—Oblon, Spivak, McClelland, Maier & Neustadt, P.C.

[57] ABSTRACT

This invention provides a polishing method including the steps of forming a film to be polished on a substrate having a recessed portion in its surface so as to fill at least the recessed portion, and selectively leaving the film to be polished behind in the recessed portion by polishing the film by using a polishing agent containing polishing particles and a solvent, and having a pH of 7.5 or more. The invention also provides a polishing apparatus including a polishing agent storage vessel for storing a polishing agent, a turntable for polishing an object to be polished, a polishing agent supply pipe for supplying the polishing agent from the polishing agent storage vessel onto the turntable, a polishing object holding jig for holding the object to be polished such that the surface to be polished of the object opposes the turntable, and a polishing agent supply pipe temperature adjusting unit, connected to the polishing agent supply pipe, for adjusting the temperature of the polishing agent.

8 Claims, 20 Drawing Sheets

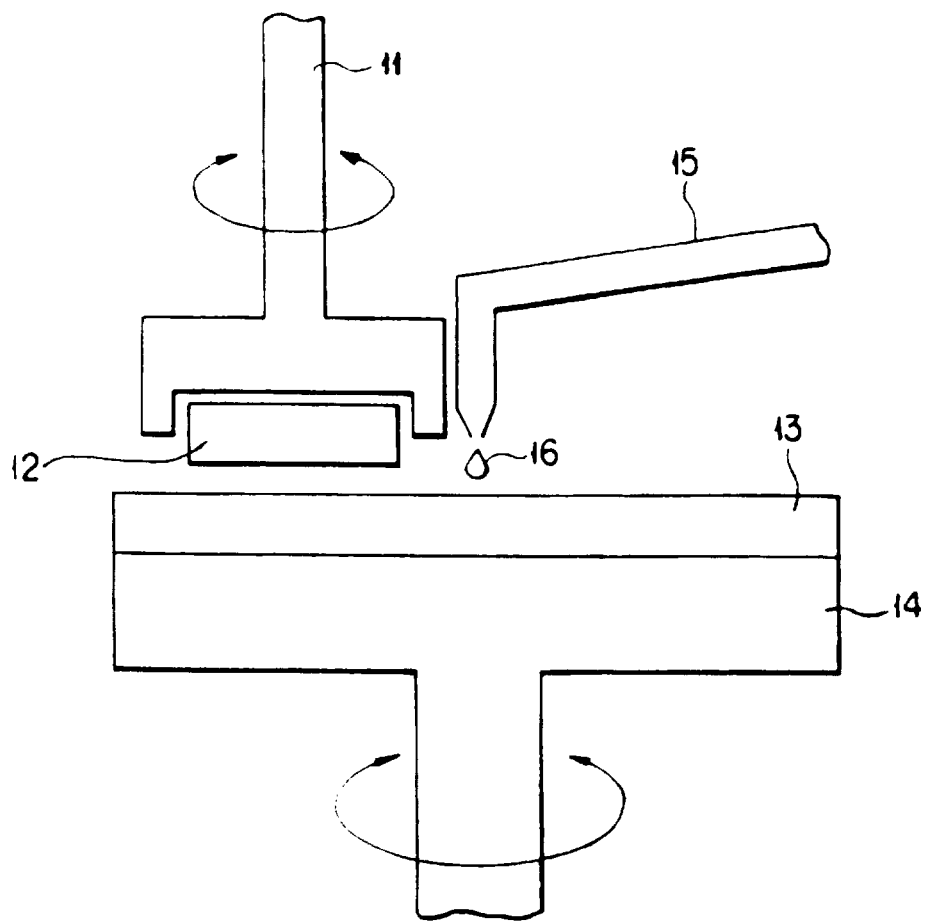
F I G. 2
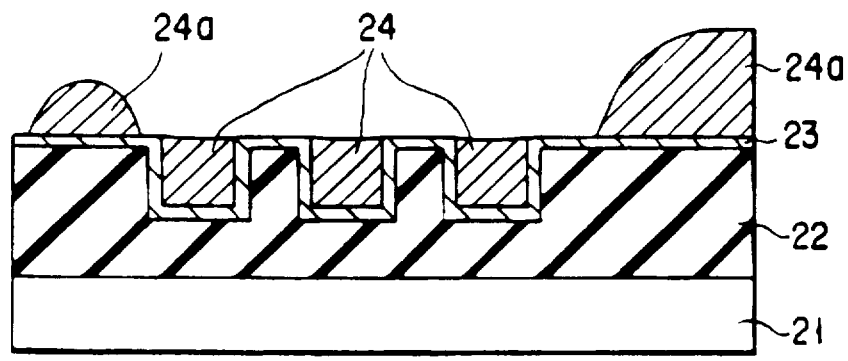
F I G. 3

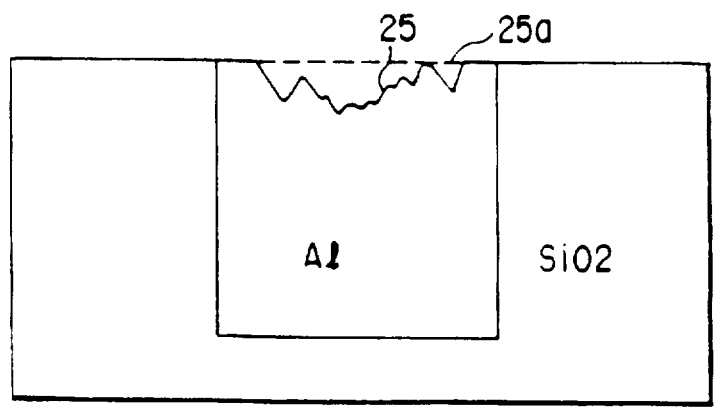
F I G. 6
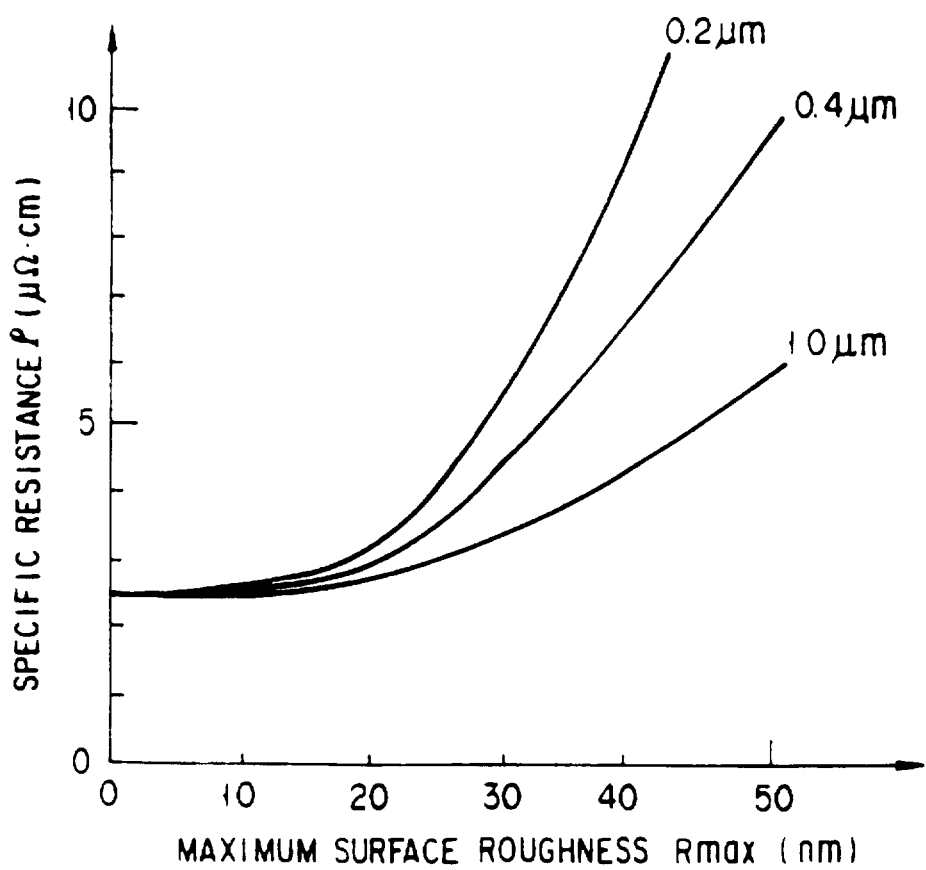
F I G. 7

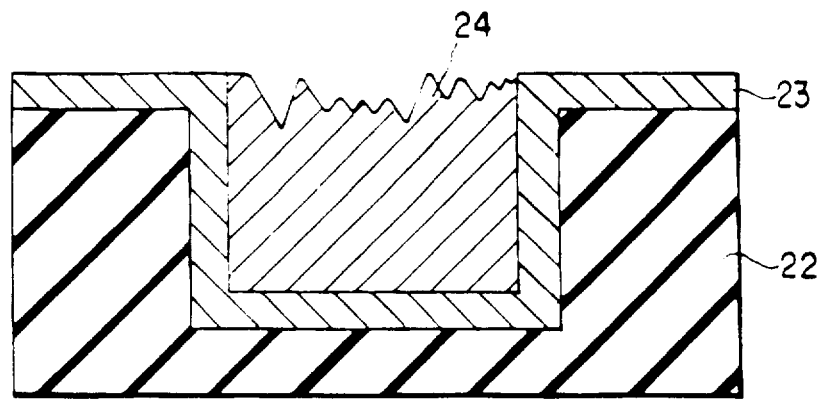
F I G. 8A
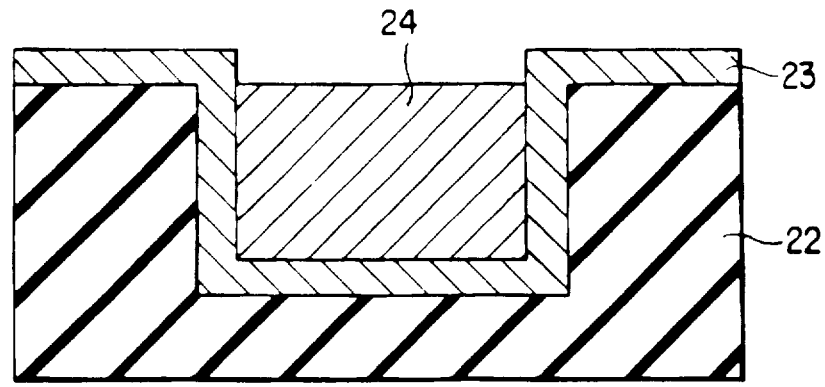
F I G. 8B
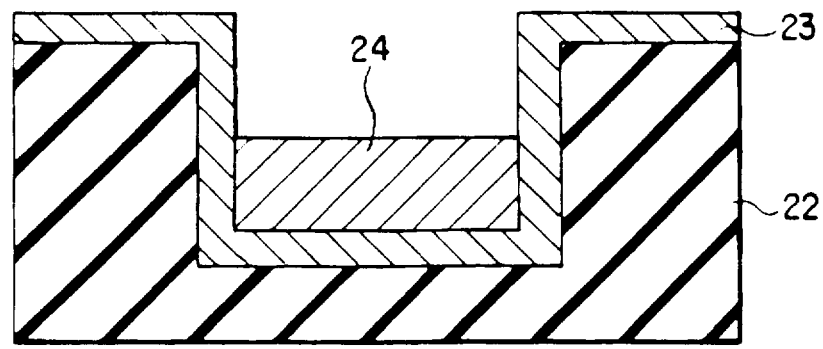
F I G. 8C

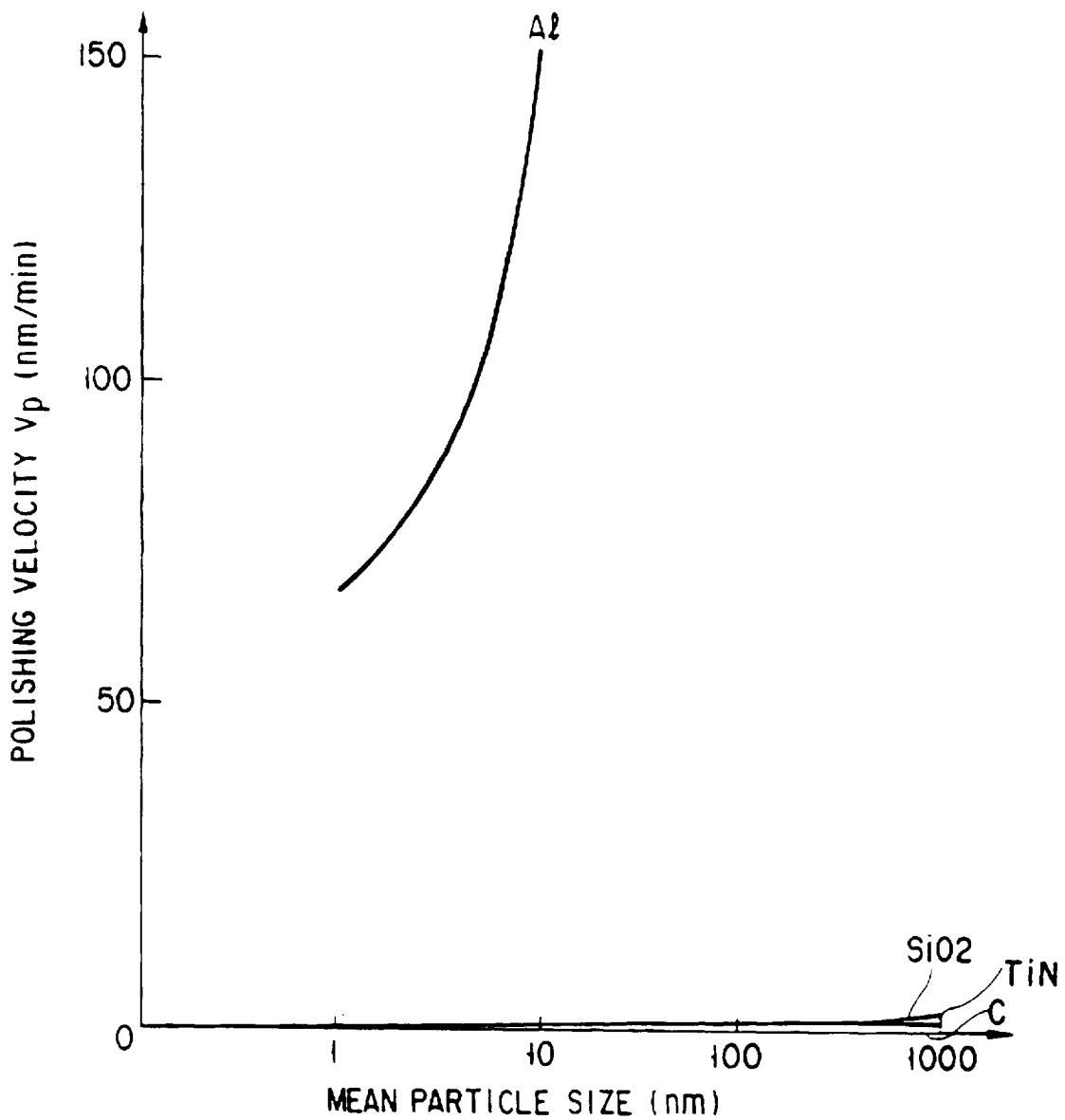
F I G. 11

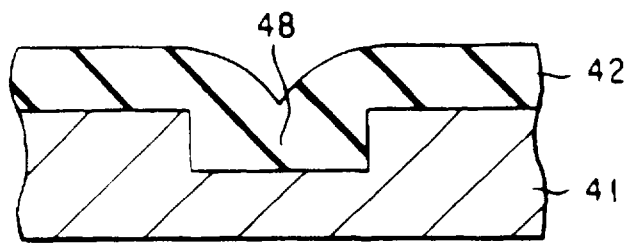
F I G. 17A
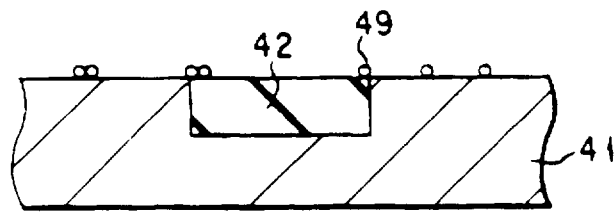
F I G. 17B
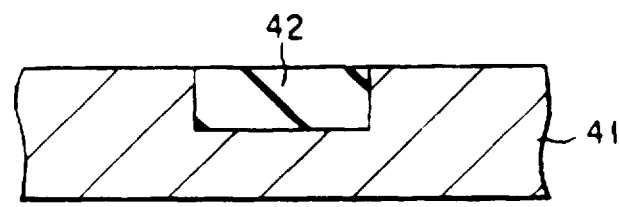
F I G. 17C

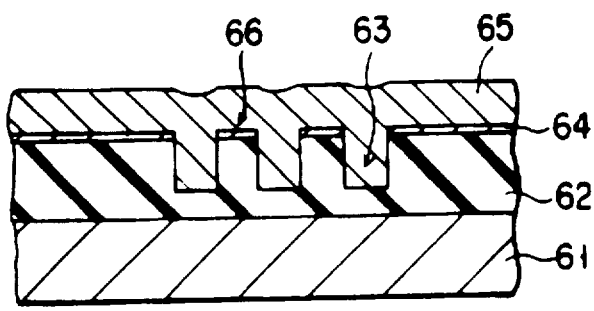
F I G. 22
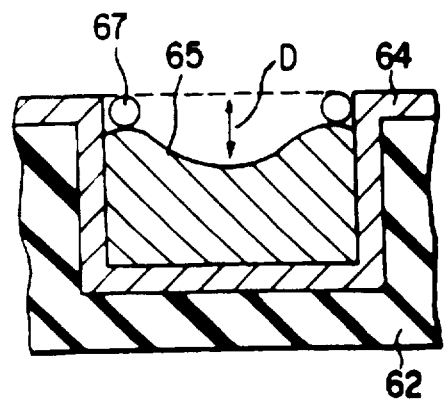
F I G. 23
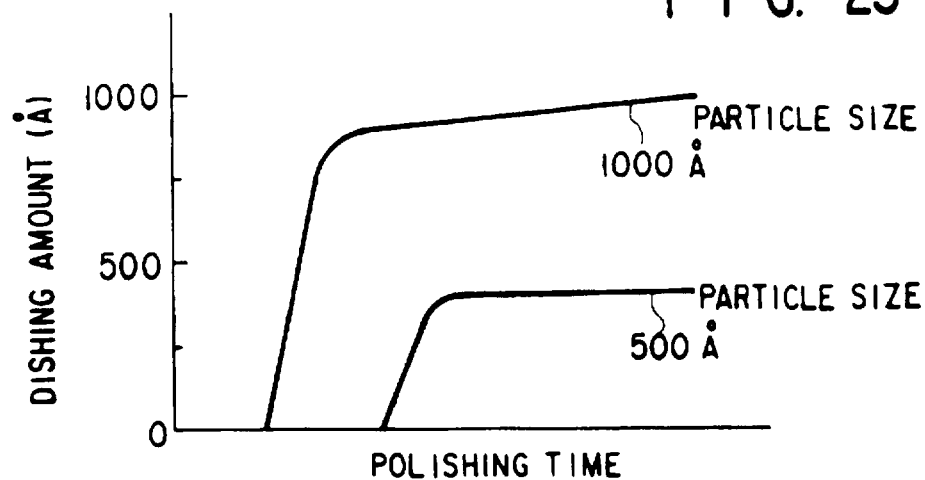
F I G. 24
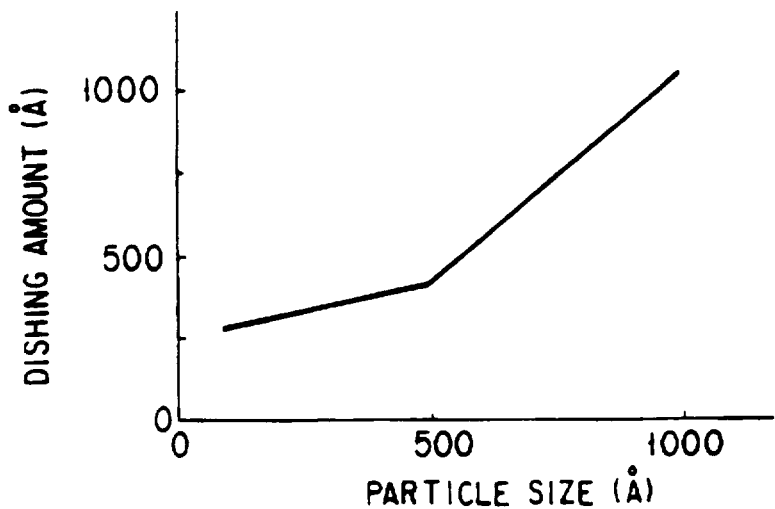
F I G. 25

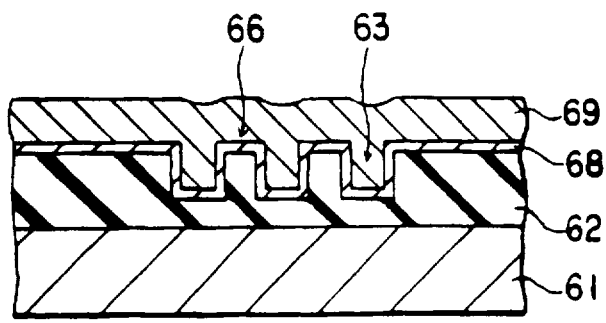
F I G. 26
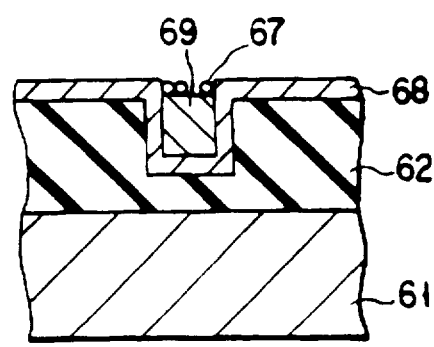
F I G. 27A
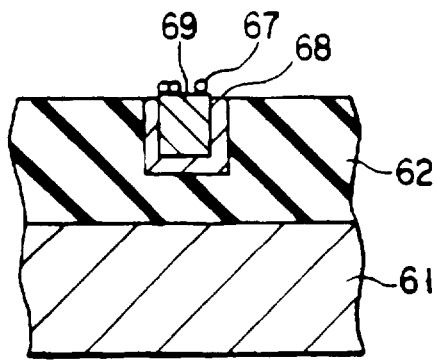
F I G. 27B
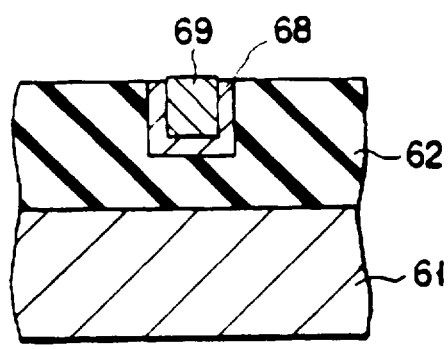
F I G. 27C
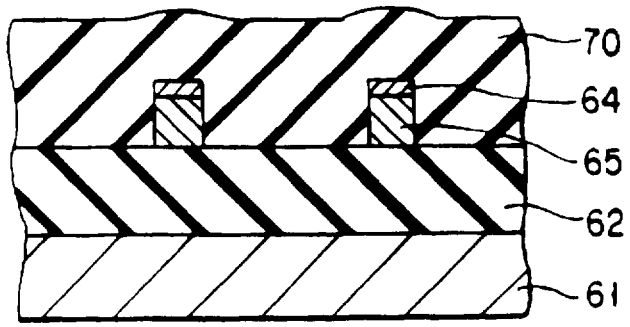
F I G. 28

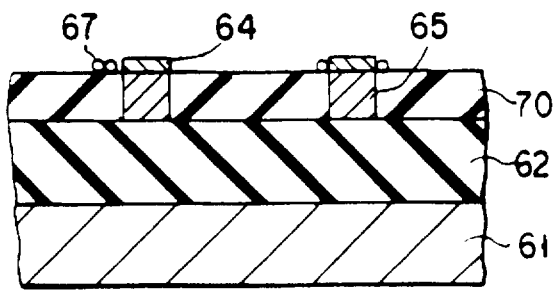
F I G. 29A
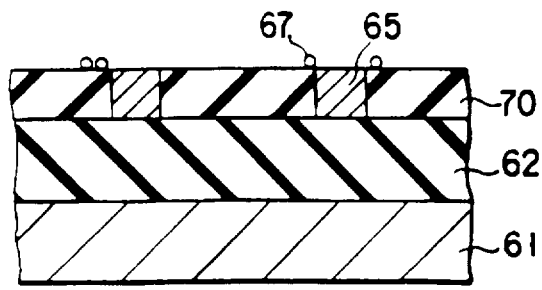
F I G. 29B
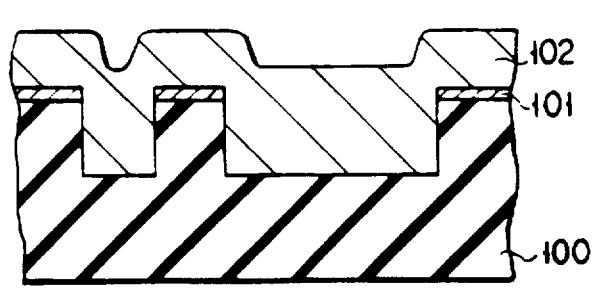
F I G. 29C
F I G. 31
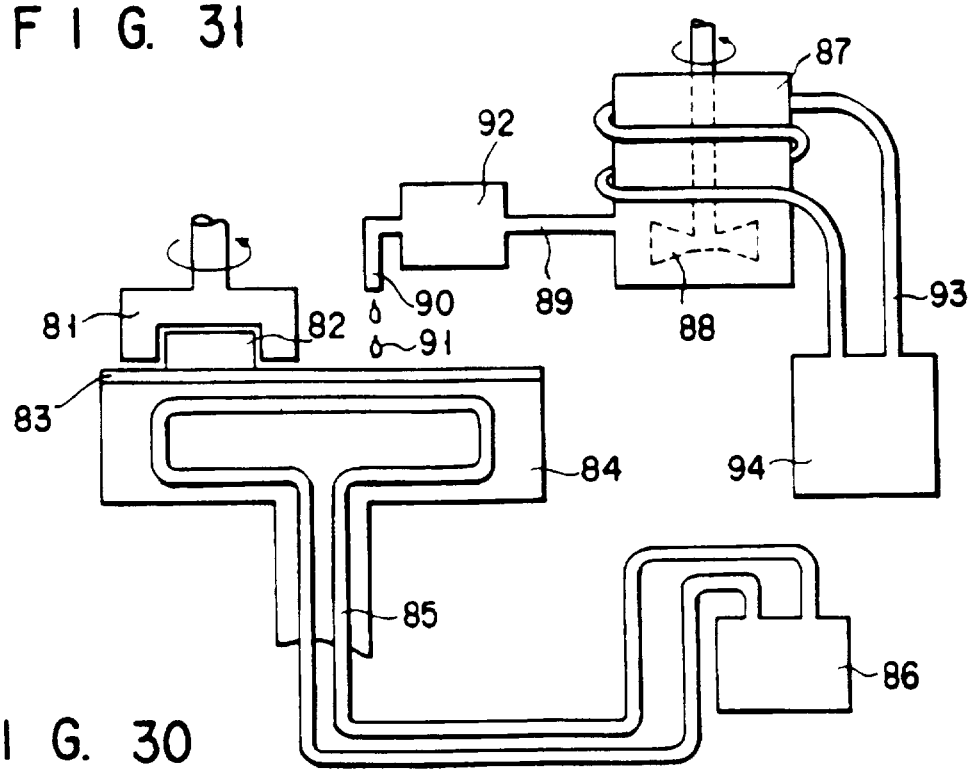
F I G. 30

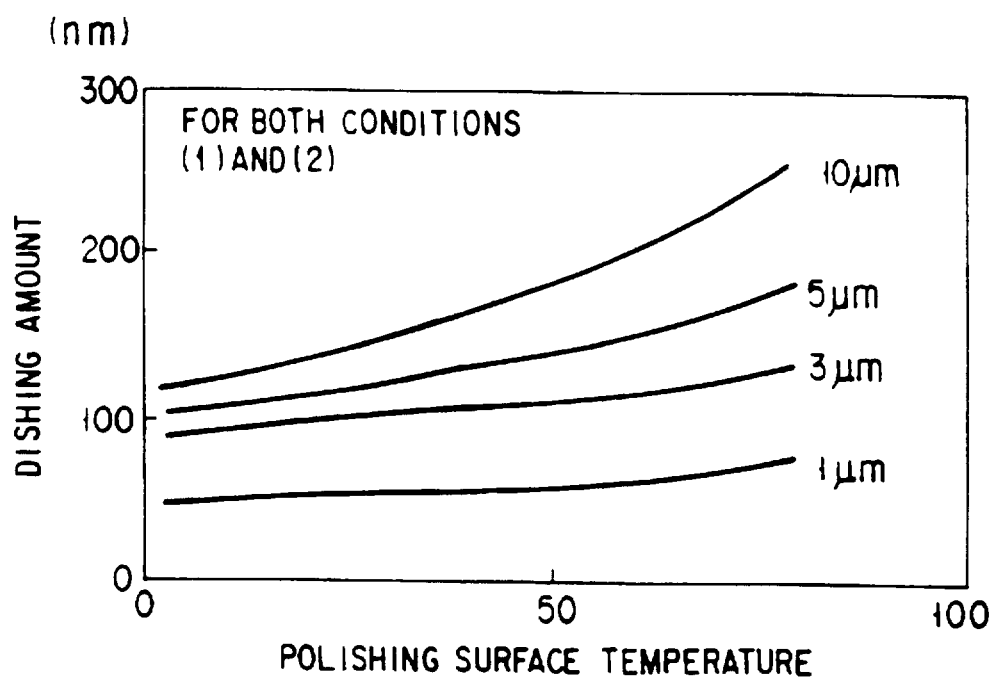
F I G. 32
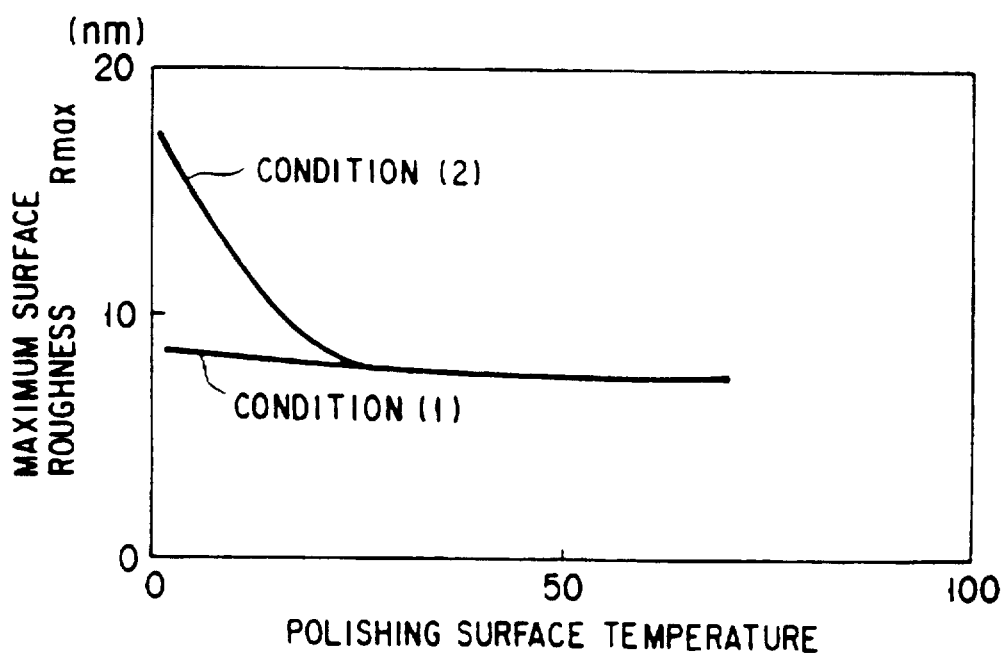
F I G. 33

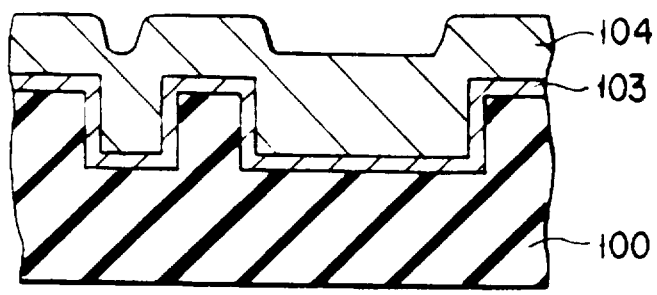
F I G. 34
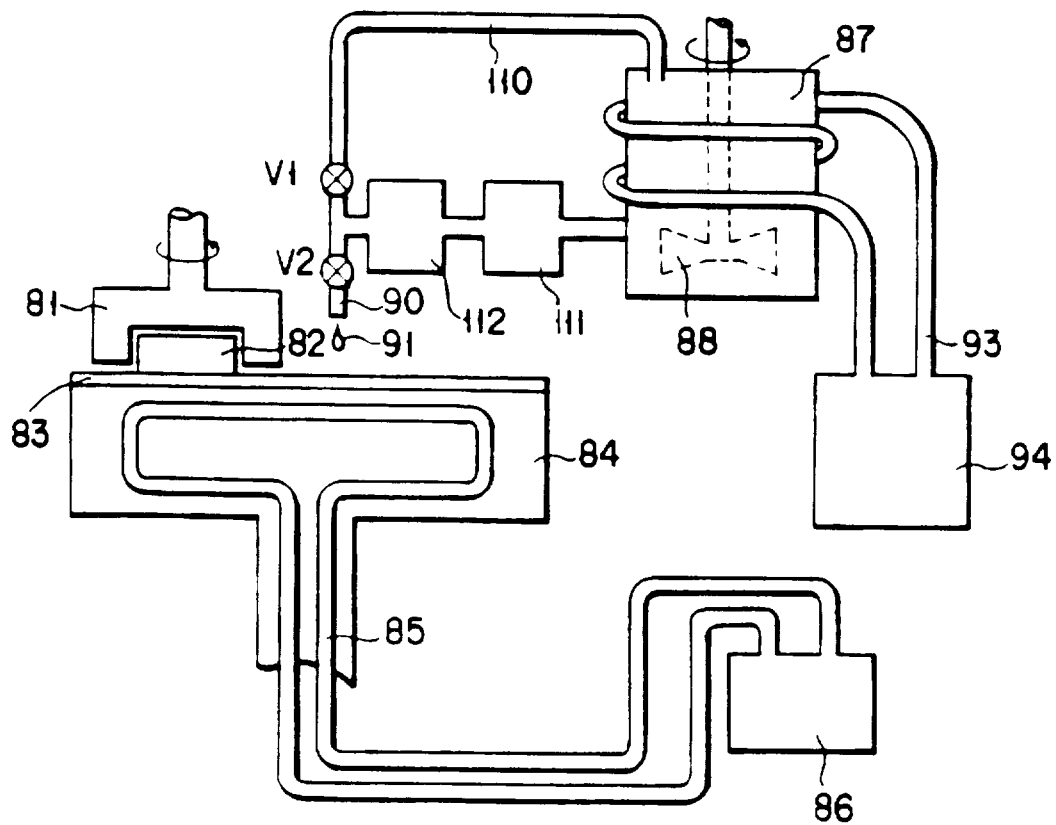
F I G. 37

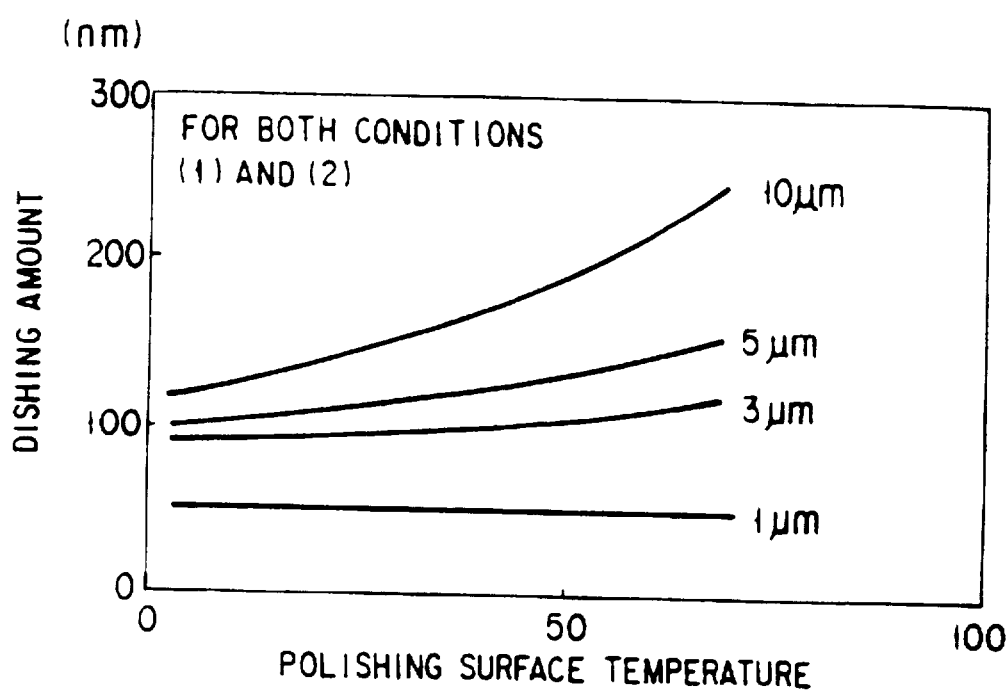
F I G. 35
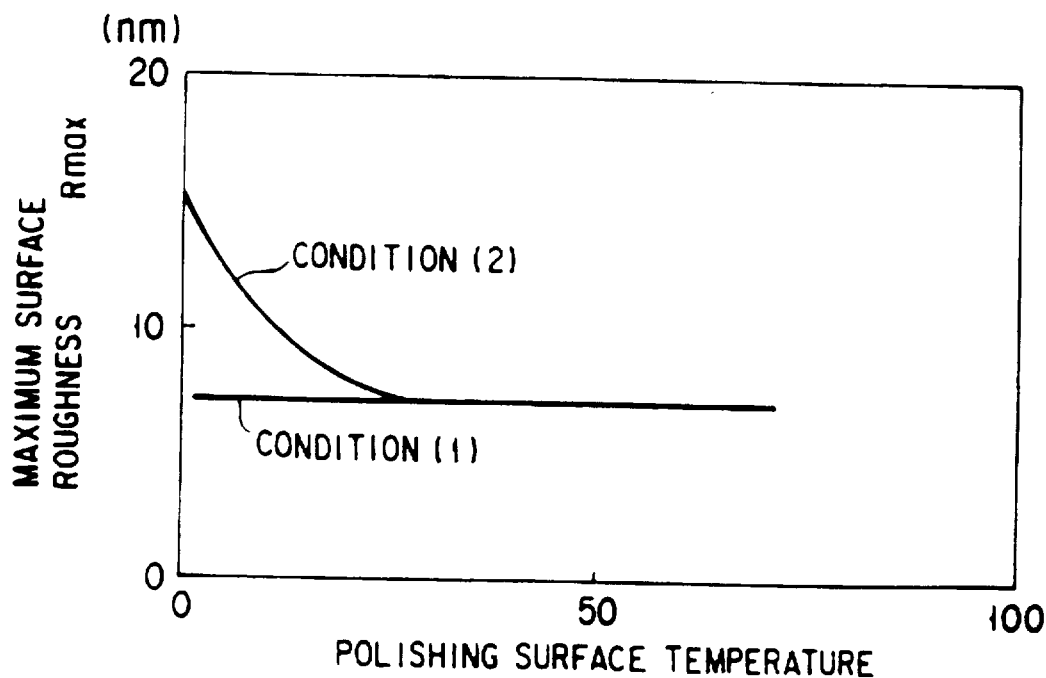
F I G. 36

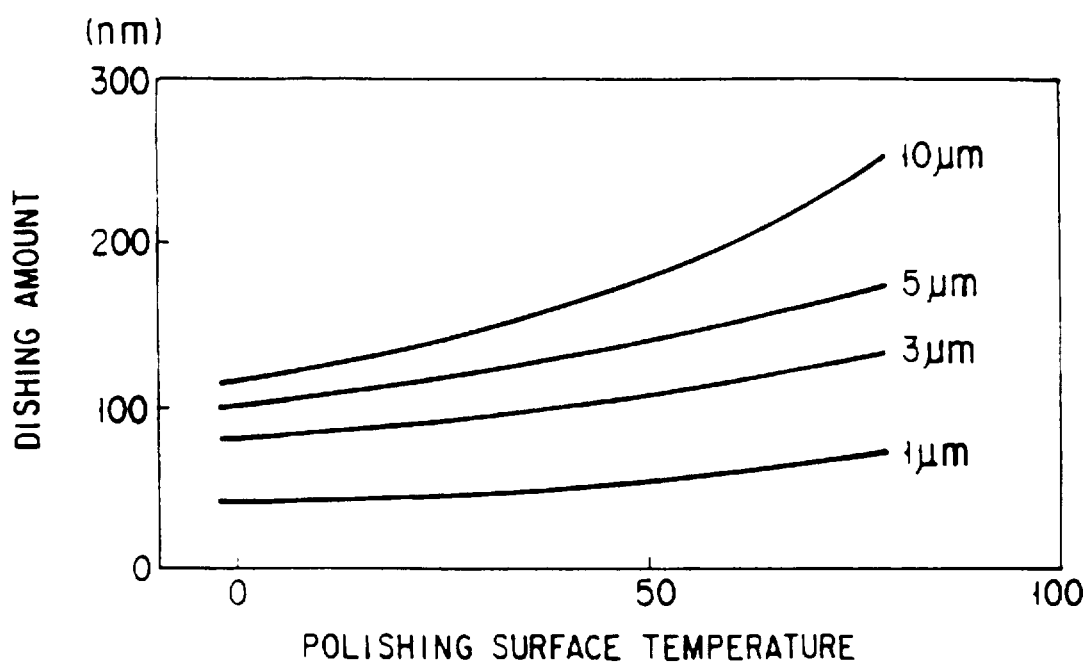
F I G. 38
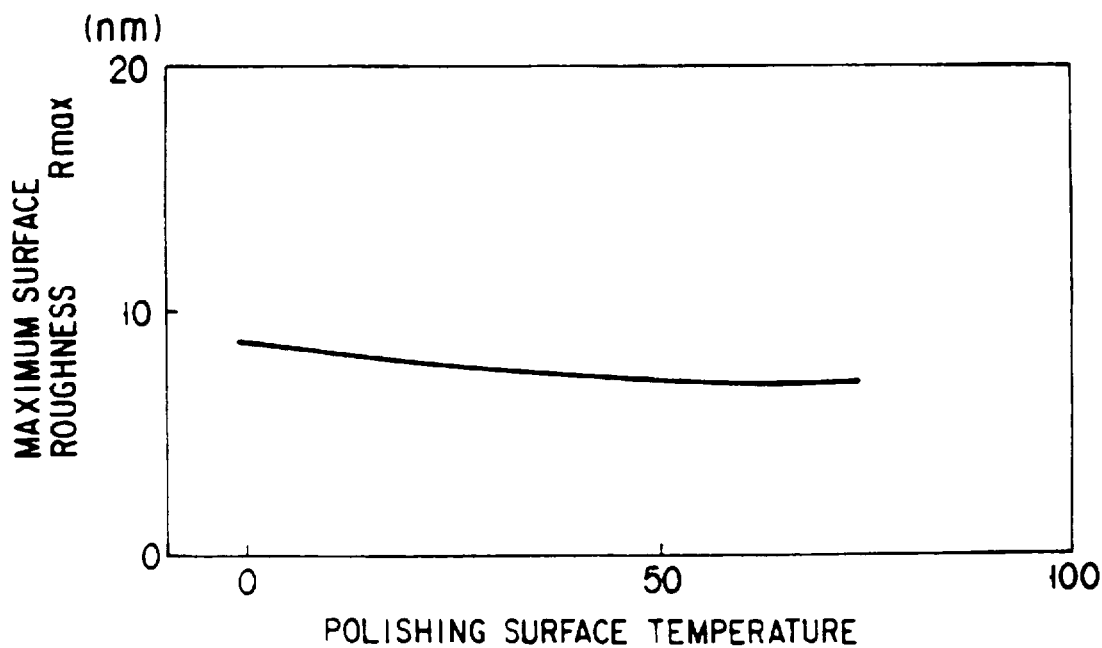
F I G. 39

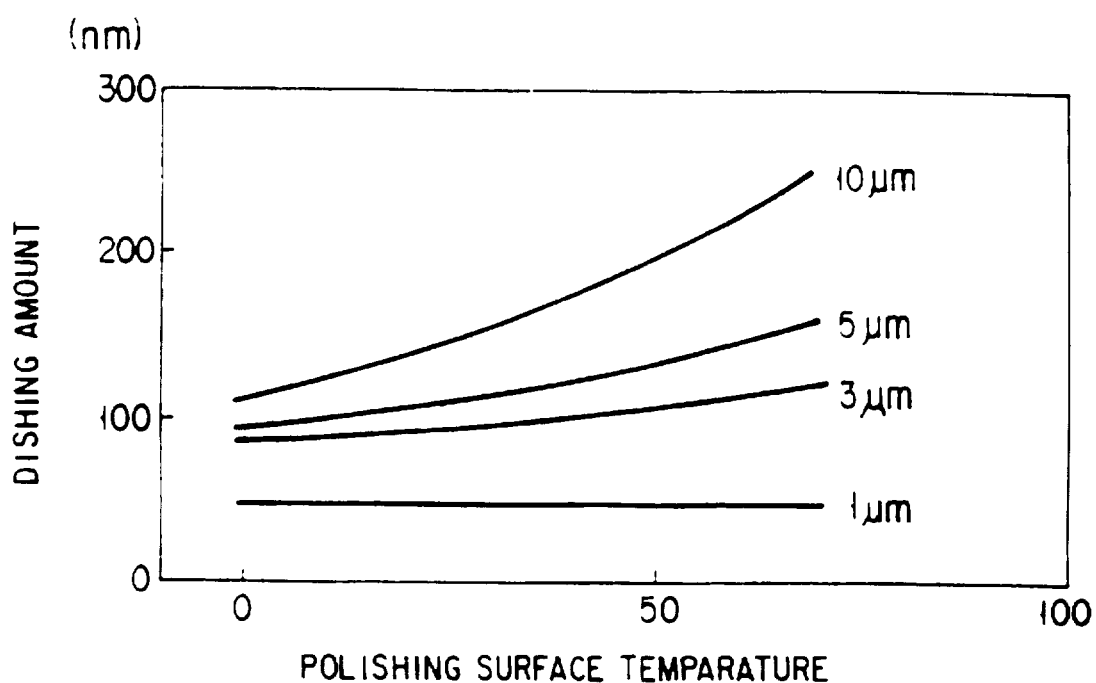
F I G. 40
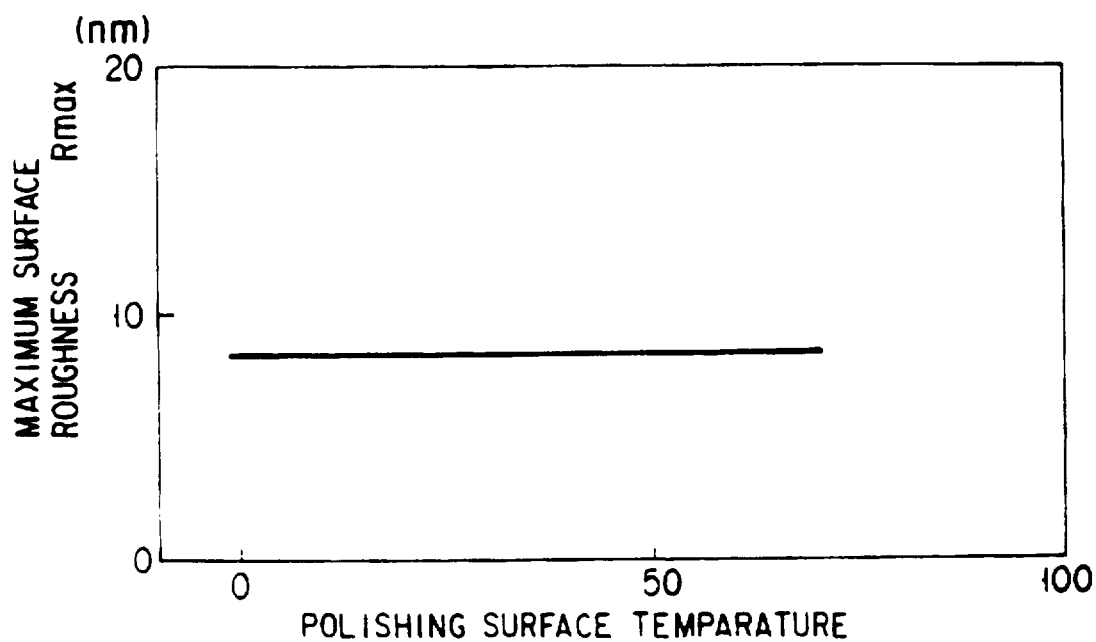
F I G. 41

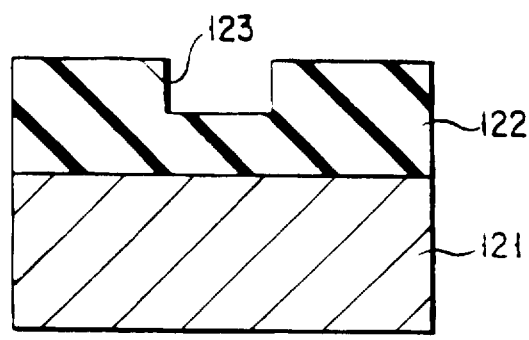
F I G. 42A
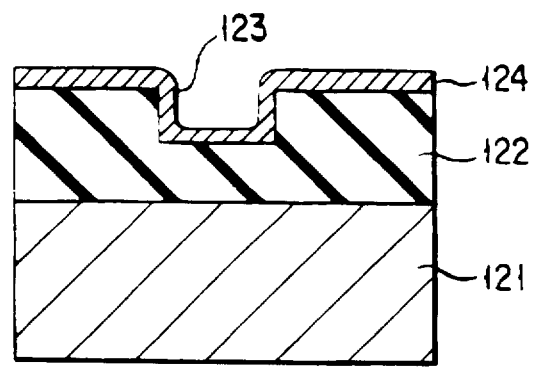
F I G. 42B
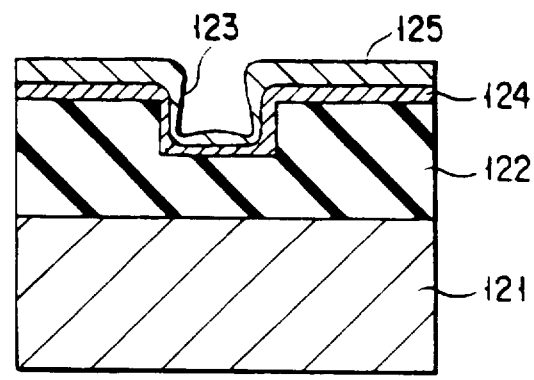
F I G. 42C
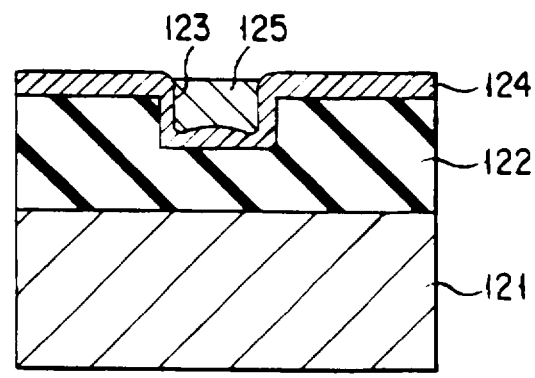
F I G. 42D

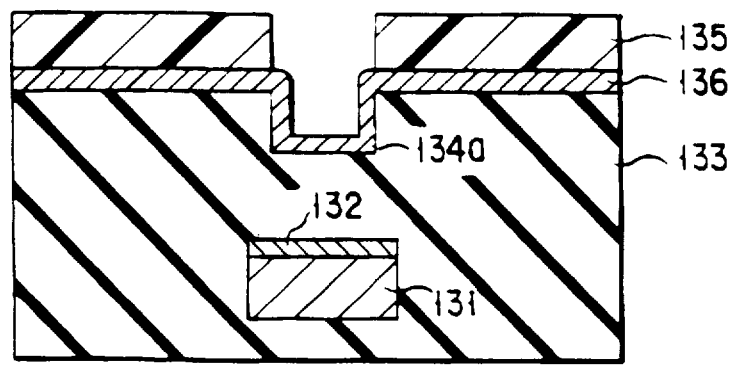
F I G. 43A
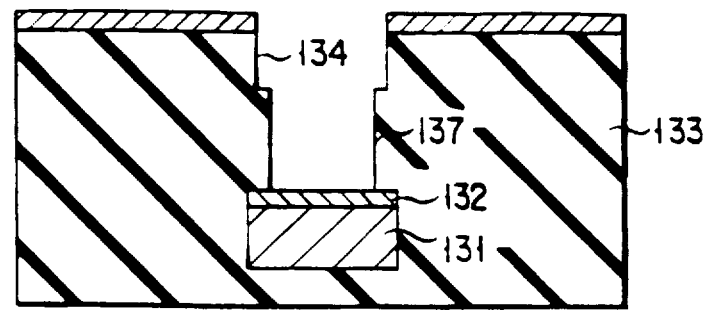
F I G. 43B
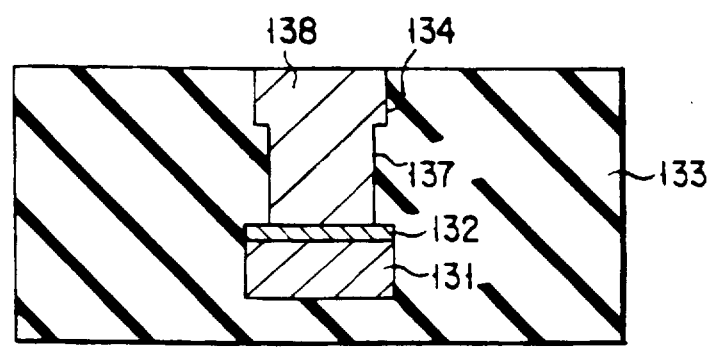
F I G. 43C

POLISHING METHOD AND POLISHING APPARATUS

This is a Division of application Ser. No. 08/300,127 filed on Sep. 2, 1994, U.S. Pat. No. 5,607,718, which is a Continuation-In-Part of application Ser. No. 08/217,642 filed on Mar. 25, 1994, now abandoned.

BACKGROUND OF THE INVENTION

1. Field of the Invention

The present invention relates to a polishing method as one semiconductor fabrication technique and an apparatus for performing the method and, more particularly, to a polishing method and a polishing apparatus for conductor films.

2. Description of the Related Art

Recently, many large-scale integrated circuits (LSIs) formed by integrating a large number of, e.g., transistors and resistors on a single chip are used in main parts of computers and communication systems. For this reason, the performance of an entire system of this type largely relies upon the performance of an individual LSI. As the packing density of an LSI has been increased, various micropatterning techniques have been developed. The minimum processing size of patterns has been decreased year by year and has already become the submicron order at present. A CMP (Chemical Mechanical Polishing) technique is one of the techniques developed to meet these strict requirements for miniaturization. This technique is essential in performing, e.g., planarization of insulating interlayers, formation of plugs, formation of buried metal interconnections, or isolation of buried elements, in semiconductor device fabrication processes.

FIGS. 1A to 1G are sectional views showing an example of formation of buried metal interconnections using a conventional polishing technique. In these drawings, only metal interconnections are illustrated, and all of other structures such as elements below an insulating film 2 are omitted. First, as shown in FIG. 1A, the insulating film 2 is formed on a semiconductor substrate 1 such as a silicon substrate, and the surface of the film 2 is planarized. Subsequently, as shown in FIG. 1B, trenches for interconnections or openings for connecting lines are formed in the insulating film 2 by using regular photolithography and etching processes. Thereafter, as shown in FIG. 1C, an interconnecting metal film 3 with a thickness larger than the depth of the trenches formed in the insulating film 2 is formed. In this case, to prevent an interdiffusion or a reaction between the insulating film 2 and the interconnecting metal film 3, a barrier metal film can also be formed between them.

Subsequently, to leave the interconnecting metal film 3 behind in only the trenches or the openings, polishing is performed for the film 3 by using alumina particles or the like as polishing particles. In this case, a film consisting of a substance having a high polishing velocity selectivity with respect to the interconnecting metal film 3 can be formed as a polishing-resistant film either above or below the Subsequently, as disclosed in the methods invented by Wada et al. (Japanese Patent Application Nos. 4-065781, 4-212380, 4-269202, and 5-67410), annealing is performed continuously in a vacuum from the state shown in FIG. 1C by using an Al film as the interconnecting metal film, thereby forming a single crystal of Al in the trenches and at the same time selectively leaving the Al film behind on projecting portions (where no trench is formed) of the insulating film 2 as shown in FIG. 1D. Thereafter, as shown in FIG. 1E, the remaining Al film is removed by polishing.

As illustrated in FIG. 1E, an ideal shape after the polishing is that the interconnecting metal film 3 remains only in the trenches, metal interconnections (connecting lines) are formed with neither flaws nor impurities on the surface, the interconnecting metal film 3 does not exist on the projecting portions at all, and the surface of the insulating film 2 is at the same level as the surface of the interconnecting metal film 3.

In an actual polishing process, however, the surface to be polished of the interconnecting metal film 3 is damaged and roughened by a mechanical action between the surface of the metal film and polishing particles or between the surface and a cad for holding a polishing agent, or polishing particles are buried in or left behind on the interconnecting metal film 3. In addition, as shown in FIG. 1F, a phenomenon termed dishing takes place in which the thickness of a central portion decreases in particularly a wide region of the interconnecting metal film 3 buried in the trenches or openings. This tendency appears conspicuously when a metal having a low hardness; and a high ductility, such as Al or Cu, is used as the material of the interconnecting metal film 3. The occurrence of flaws or dishing, or the residue of polishing particles on the surface of an interconnecting metal film increases the resistance of resulting interconnections or causes disconnections, leading to a decrease in reliability or in product yield.

An example of polishing that can prevent the occurrence of flaws or dishing on the surface of an interconnecting metal film is, if a film to be polished is an Al film, a treatment using a slurry prepared by dispersing alumina particles in an aqueous acidic solution with a pH of 3 or less (Beyer et al., U.S. Pat. No. 4,944,836). In this polishing, however, the polishing rate ratio ($SiO_2/Al$) of $SiO_2$ to Al cannot be satisfactorily decreased. Therefore, if this polishing is applied to the formation of buried interconnections, the $SiO_2$ film (insulating film 2) is also polished at the same time as the Al film (interconnecting metal film 3) is polished. This decreases the depth of trenches formed in the $SiO_2$ film, resulting in decreased dimensions of interconnections. In addition, this polishing has another problem of corrosion of a polishing apparatus resulting from the use of the aqueous acidic solution.

On the other hand, a method using no polishing particles is reported (International Electron Devices Meeting Technical Digest 1992, p. 976, Y. Hayashi et al.), in which aluminum plugs are formed by polishing using a solution mixture of an amine and hydrogen peroxide water. In this method, since no polishing particles are used, the polishing proceeds nearly chemically, and neither flaws nor roughness rarely takes place in aluminum. However, dishing occurs significantly because the ratio (polishing velocity/dissolution velocity) of the polishing velocity of aluminum to the dissolution velocity of aluminum with respect to the solution mixture is low. For example, if this polishing is performed for a sample in the state shown in FIG. 1D, the Al film (interconnecting metal film 3) formed in the trenches to serve as interconnections vanishes before the Al film remaining on the projecting portions are removed, as shown in FIG. 1G.

SUMMARY OF THE INVENTION

The present invention has been made in consideration of the above situations and has as its object to provide a polishing method and a polishing apparatus capable of polishing while suppressing the occurrence of flaws (roughness) and dishing on the surface of an interconnection to such an extent that no practical problem arises.

The present invention provides a polishing method comprising the steps of forming a film to be polished on a substrate having a recessed portion in its surface so as to fill at least the recessed portion, and selectively leaving the film to be polished behind in the recessed portion by polishing the film by using a polishing solution containing polishing particles and a solvent, and having a pH of 7.5 or more.

In addition, the present invention provides a polishing method comprising the steps of: forming a film to be polished on a substrate having a recessed portion in a surface thereof so as to fill at least the recessed portion; and selectively leaving the film to be polished behind in the recessed portion by polishing the film by using a polishing agent containing a solution for etching the film to be polished, a corrosion inhibitor of the film to be polished, and polishing particles.

The present invention also provides a polishing apparatus comprising a polishing agent storage vessel for storing a polishing agent, a turntable for polishing an object to be polished, a polishing agent supply pipe for supplying the polishing agent from the polishing agent storage vessel onto the turntable, a polishing object holding jig for holding an object to be polished such that the surface to be polished of the object opposes the turntable, and polishing agent supply pipe temperature adjusting means, connected to the polishing agent supply pipe, for adjusting the temperature of the polishing agent.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the Preferred embodiments given below, serve to explain the principles of the invention.

FIG. 2 is a schematic view showing one example of a polishing apparatus used in a polishing method of Embodiments 1 to 3;

FIG. 3 is a sectional view for explaining one example of the polishing method of Embodiment 1;

FIG. 6 is a view for explaining the definition of a specific resistance;

FIG. 7 is a graph showing plots of the relationship between the specific resistance and the maximum surface roughness for different line widths;

FIGS. 8A to 8C are sectional views showing the states of polished surfaces at different pH's of a polishing solution;

FIG. 11 is a graph showing plots of the relationship between the polishing velocity and the mean particle size of polishing particles for Al, TiN, $SiO_2$, and C;

FIGS. 14 to 17C are sectional views for explaining other examples of the polishing method of Embodiment 2;

FIGS. 22, 26 and 28 are sectional views showing other examples of the object to be polished by the polishing method of Embodiment 3;

FIG. 23 is a sectional view for explaining a dishing amount;

FIG. 24 is graph showing the relationship between the dishing amount and the polishing time;

FIG. 25 is a graph showing the relationship between the dishing amount and the mean particle size of polishing particles;

FIGS. 27A to 27C and FIGS. 29A to 29C are sectional views for explaining other examples of the polishing method of Embodiment 3;

FIG. 30 is a schematic view showing one example of a polishing apparatus of Embodiment 4;

FIG. 31 is a sectional view showing one example of an object to be polished which is used in performing polishing by using the polishing apparatus of Embodiment 4;

FIGS. 32, 35, 38, and 40 are graphs each showing the relationship between the dishing amount and the polishing surface temperature;

FIGS. 33, 36, 39, and 41 are graphs each showing the relationship between the maximum surface roughness and the polishing surface temperature;

FIG. 34 is a sectional view showing another example of the object to be polished which is used in performing polishing by using the polishing apparatus of the third invention of the present invention; and FIG. 37 is a schematic view showing another example of the polishing apparatus of Embodiment 4.

DETAILED DESCRIPTION OF THE PREFERRED EMBODIMENTS

Figure 1A:
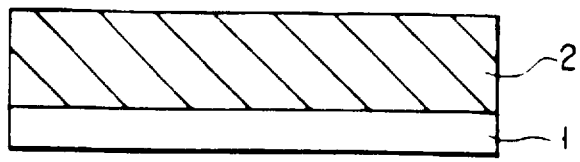
FIGS. 1A to 1G are sectional views for explaining conventional polishing.
Figure 1B:
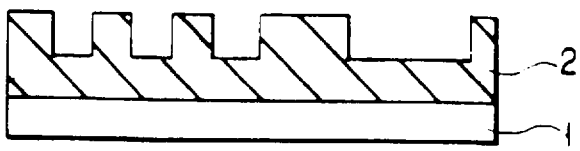
Figure 1C:
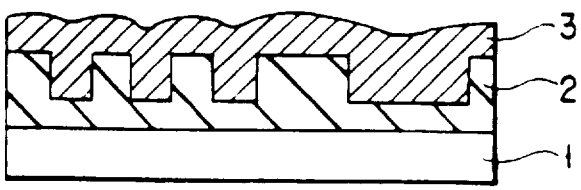
Figure 1D:
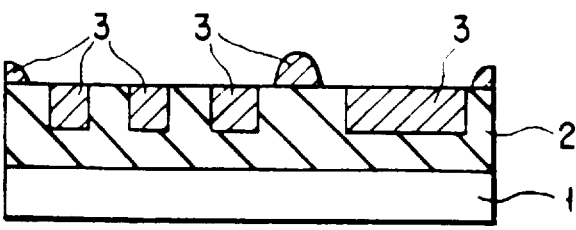
Figure 1E:
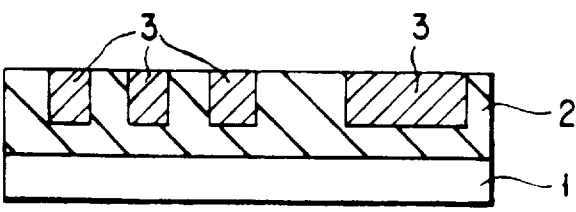
Figure 1F:
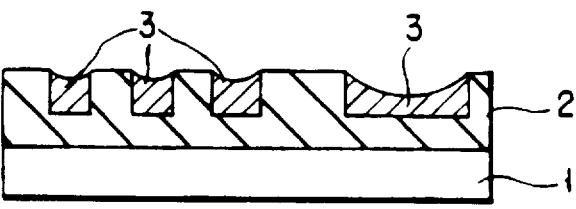
Figure 1G:
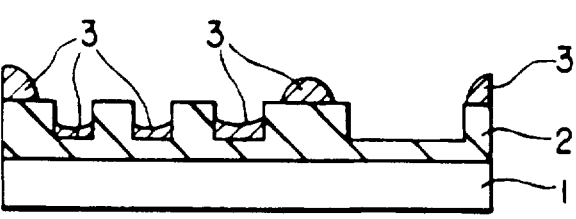

Focusing attention on the relationships between the mean particle size of polishing particles and the occurrence of flaws or dishing on an object to be polished and between the pH of a polishing solution and the occurrence or flaws or dishing, the present inventors have found that polishing can be performed without causing flaws and dishing on an object to be polished by defining the mean particle size of polishing particles and the pH of a polishing solution within respective predetermined ranges.

The embodiments of the present invention will be described in detail below with reference to the accompanying drawings.

Embodiment 1

FIG. 2 is a schematic view showing one example of a polishing apparatus used in a polishing method of the present invention. This polishing apparatus comprises a rotatable polishing table 14, a polishing pad 13 adhered to the polishing table 14, a rotatable sample holder 11 arranged above the polishing table 14, and a polishing solution supply pipe 15 connected to a polishing solution tank. The injection port of the pipe 15 extends to a portion close to the polishing pad 13. An object 12 to be polished is vacuum-chucked to the sample holder 11 such that its surface to be polished opposes the polishing pad 13. A polishing solution 16 is supplied onto the polishing pad 13 through the polishing solution supply pipe 15. The supply amount of the solution 16 can be controlled at a given value.

In this embodiment, materials having different hardnesses (Shore hardnesses of 66 to 88) and consisting of different substances (foam polyurethane, sueded foam polyurethane, unwoven fabric, and resin-impregnated unwoven fabric) were used to form the polishing pad 13. Each resultant polishing pad was used to polish an object (Al film) to be polished, and the occurrence of flaws on the object was checked. As a result, when the sueded foam polyurethane was used as the material, no flaws with a depth of 5 nm or more w surface of the object to be polished hardness. That is, the sueded foam found to be the most favorable mater pad. In this embodiment, therefore, used as the polishing pad 13.

As the polishing agent, a colloidal solution prepared by dispersing $SiO_2$ particles in a dilute solution of piperazine $[C_4H_{10}N_2]$ was used. In this embodiment, various polishing solutions were prepared by changing the mean particle size of the $SiO_2$ particles as polishing particles in the polishing solution by changing the ratio of the $SiO_2$ particles within the range of 50 wt % or less. The pH of each polishing solution was adjusted by controlling the amine concentration.

FIG. 3 is sectional view showing the object to be polished used in this embodiment. In FIG. 3, reference numeral 21 denotes a silicon substrate. An $SiO_2$ film 22 is formed on this silicon substrate 21. Trenches each 0.4 to 10 μm in width and about 0.4 μm in depth for forming interconnections are formed in the $SiO_2$ film 22. On the entire surface of the $SiO_2$ film 22 having these trenches, a 50-nm thick carbon film 23 is formed as a polishing-resistant film by using DC magnetron sputtering. On the carbon film 23, a polycrystalline Al film 24 is formed by the DC magnetron sputtering. After being formed in a vacuum without heating, this polycrystalline Al film 24 is continuously heat-treated in a vacuum. Consequently, polycrystalline aluminum flocculates and is buried in the trenches, forming a single crystal of aluminum. In this case, a polycrystalline Al film 24a as part of the Al film is not buried in the trenches even after the flocculation but left behind in the form of a single crystal in a wide region other than the trenches.

Figure 4:
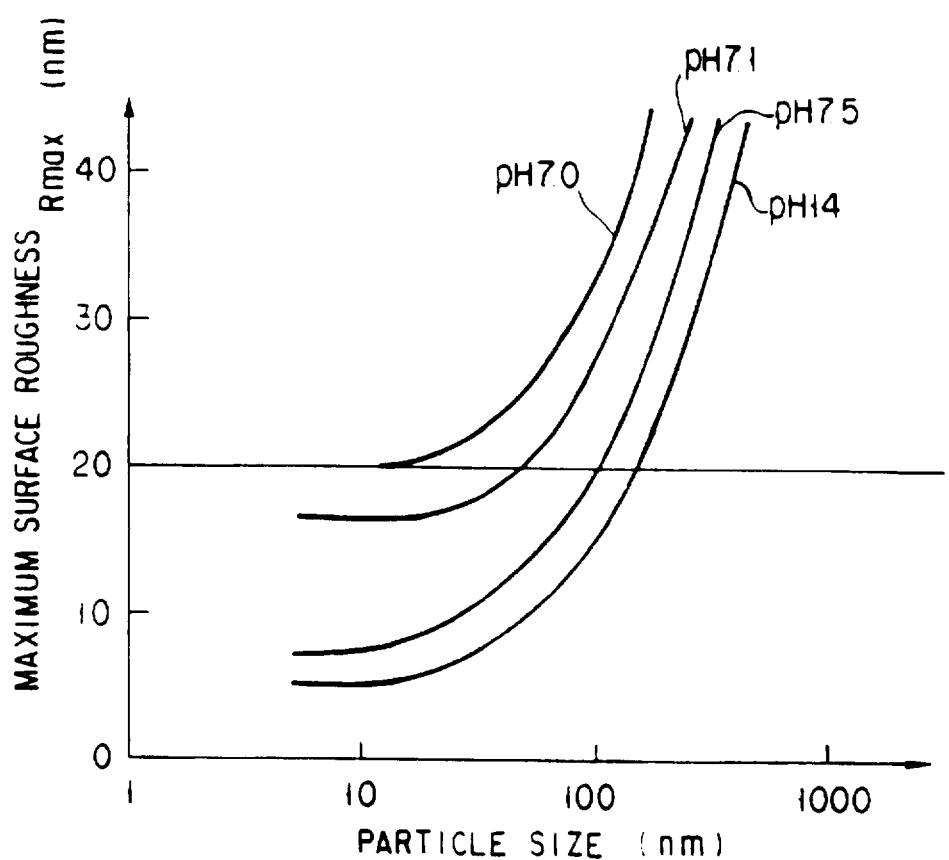
FIG. 4 is a graph showing the relationship between the particle size of polishing particles and the maximum surface roughness of an Al film.
Figure 5:
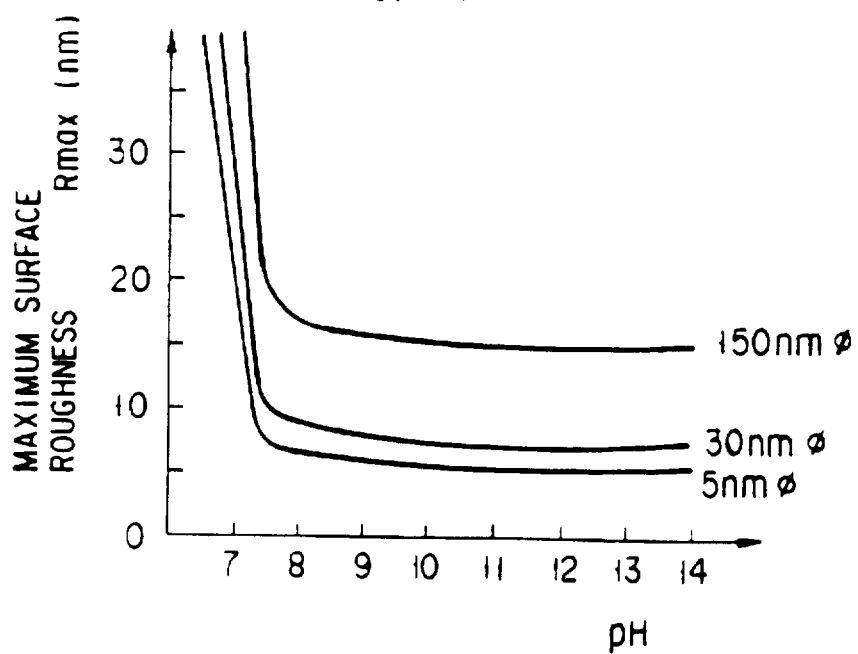
FIG. 5 is a graph showing the relationship between the pH of a polishing solution and the maximum surface roughness.

Polishing (CMP) was performed for the resultant object to be polished to remove the Al film 24a remaining on the region except for the trenches. FIG. 4 is a graph showing the relationship between the particle size of the polishing particles and the maximum surface roughness $R_{max}$ of the Al film 24 in this polishing. Referring to FIG. 4, the particle size on the abscissa means the maximum diameter of the polishing particles contained in the polishing agent. FIG. 5 is a graph showing the relationship between the pH of the polishing solution and the maximum surface roughness $R_{max}$. Note that the results shown in FIGS. 4 and 5 were obtained by the polishing performed by setting the polishing pressure at 300 gf/cm² and the rotating speeds of the sample holder 11 and the polishing table 14 at 100 rpm.

In FIG. 4, the maximum surface roughness $R_{max}$ is 20 nm when the particle size is 100 nm and the pH is 7.5, and when the particle size is 150 nm and the pH is 14. As can be seen from FIG. 4, when the particle size of the polishing particles is decreased, the maximum surface roughness $R_{max}$ also decreases. This is so because flaws on the surface of aluminum are formed by a mechanical action between the aluminum and the polishing particles. It is also found from FIG. 4 that the slopes of the curves are reduced as the particle size of the polishing particles decreases. Especially when the pH of the polishing solution is 7.5 or higher, the maximum surface roughness $R_{max}$ is nearly constant if the particle size of the polishing particles is around 10 nm. This reason for this can be assumed that the polishing particles readily flocculate when the particle size of the polishing particles decreases. That is, it is assumed that even if the particle sizes of individual polishing particles are small, these small polishing particles flocculate to form large particles, and these large particles take part in actual polishing.

FIG. 5, on the other hand, reveals that the maximum surface roughness $R_{max}$ decreases with increasing pH of the polishing solution. The maximum surface roughness $R_{max}$ decreases abruptly especially when the pH of the polishing solution is between 7 and 7.5. The reason for this can be assumed as follows. That is, aluminum generally has a property of forming a passive film such as an oxide film on its surface in an aqueous solution. This passive film is stable in a pH range between 4 and 7.5 and can function well as a barrier for protecting aluminum over this pH range. However, in a solution with a pH higher than 7.5, the performance of the passive film as the barrier weakens abruptly, resulting in dissolution of aluminum. When this characteristic of aluminum is taken into account, it can be assumed that the maximum surface roughness $R_{max}$ changes abruptly around a pH of 7.5 because a chemical action with respect to aluminum abruptly increases near a pH of 7.5.

It was also found that when the value of the polishing pressure was 300 gf/cm² or larger, the maximum surface roughness $R_{max}$ increased in nearly proportion to an increase in the polishing pressure. If the polishing pressure was lower than 300 gf/cm², the maximum surface roughness $R_{max}$ almost saturated. As an example, the value of the maximum surface roughness $R_{max}$ when the polishing pressure was 30 gf/cm² was about 90 to 100% of the value when he polishing pressure was 300 gf/cm². No particular change was found in the maximum surface roughness $R_{max}$ when the rotating speeds of the sample holders 11 and the polishing table 14 ranged between 50 and 500 rpm.

It is apparent from FIGS. 4 and 5 that, by polishing the Al film 24 at least under the conditions that the particle size of the polishing particles is 100 nm or smaller and the pH of the polishing solution is 7.5 or higher, the maximum surface roughness $R_{max}$ can be decreased to 20 nm or less at which no practical problem arises. Note that even if these conditions are not met, the maximum surface roughness $R_{max}$ can be decreased to 20 nm or less provided that the pH of the polishing solution is 7.5 or higher. It is also apparent from FIGS. 4 and 5 that the $R_{max}$ is 20 nm when the pH is 7.0 and the particle size is 5 nm, and when the pH is 7.5 and the particle size is 100 nm. This demonstrates that if the pH of the polishing solution ranges from 7.0 to 7.5, the maximum surface roughness can be decreased to 20 nm or less by properly decreasing the particle size of the polishing particles. That is, polishing is preferably performed by a particle size defined on and below a line smoothly connecting a point at which the pH of the polishing solution is 7.0 and the particle size is 5 nm and a point at which the pH is 7.5 and the particle size is 10 nm in FIG. 4. When the problem of dishing is taken into consideration, however, a particle size of 100 nm or smaller and a pH of the polishing solution of 7.5 or higher are more favorable as the polishing conditions.

It is very important in actual formation of LSI interconnections that the maximum surface roughness $R_{max}$ is 20 nm or less. FIG. 7 shows plots of the relationship between the maximum surface roughness $R_{max}$ and the specific resistance $\rho$ for line widths of 0.2, 0.4, and 1.0 μm. This specific resistance is different from a commonly defined constant which is determined by the type and structure of substance. The definition of the specific resistance herein used will be described below with reference to FIG. 6. As shown in FIG. 6, the specific resistance of an Al interconnection 25 (solid line) on the polished surface of which a flaw is formed is calculated by assuming that this Al interconnection 25 has the same sectional area as that of an Al interconnection 25a (dotted line) having no flaws. Generally, he specific resistance $\rho$ is represented by $\rho = R \cdot S/L$ assuming that the length of an interconnection is L, its sectional area is S, and its resistance is R. Therefore, in the graph shown in FIG. 7, each curve is plotted for one particular line width on the basis of the measurement value of the resistance R with respect to the maximum surface roughness $R_{max}$ while S and L are fixed. As shown in FIG. 7, the specific resistance p for a line width of submicron order increases abruptly from a maximum surface roughness $R_{max}$ of 20 nm. The rate of this increase increases as the line width decreases. If an interconnection with a line width of 0.2 μm, for example, is to be formed as a practical LSI interconnection, a flaw with a depth of 20 nm or more largely increases the specific resistance, significantly degrading the performance and reliability of the device. Therefore, decreasing the maximum surface roughness $R_{max}$ to 20 nm or less is very important in forming practical LSI interconnections.

FIGS. 8A to 8C are sectional views showing the surface conditions of the object to be polished shown in FIG. 3 when the pH of the polishing solution was changed between 7 and 13. More specifically, each of FIGS. 8A to 8C illustrates the surface of the object polished under the conditions described above and observed by using an optical microscope and a scanning electron microscope (SEM). Note that the polishing pressure, the rotating speed and the polishing time were kept constant for all the pH values. As shown in FIG. 8A, when the pH of the polishing solution was 7, a large number of flaws were observed on the surface of the Al film 24. This reason for this is assumed that almost no chemical reaction took place. When the pH of the polishing solution was 10, as shown in FIG. 8B, no flaws were formed on the surface of the Al film 24, and no decrease in film thickness was found. When the pH of the polishing solution was 13, as shown in FIG. 8C, no flaws were found on the surface of the Al film 24. In this case, however, the film thickness decreased considerably due to a large dishing. That is, the dishing appeared more conspicuously when the pH of the polishing solution was raised to increase the chemical action.

To suppress the dishing appearing significantly when the pH of the polishing solution is raised, it is necessary to increase the ratio ($V_P/V_E$) of the polishing velocity $V_P$ of aluminum to the dissolution velocity $V_E$ of aluminum with respect to the polishing agent. Generally, protecting portions on the surface of aluminum being polished are readily affected by the mechanical action of the polishing particles held by the polishing pad adhered to the polishing table 14, and are also affected easily by the chemical action since new surfaces are exposed to the polishing agent at any instant. That is, the projecting portions undergo both the mechanical and chemical actions. Recessed portions, on the other hand, are hardly influenced by the mechanical action and are only isotropically etched by the chemical component of the polishing agent. That is, the recessed portions can be assumed to undergo only the chemical action. To discourage the dishing, therefore, it is most desirable that he dissolution velocity $V_E$ of aluminum with respect to the polishing agent be 0 nm/min in the recessed portions.

Figure 9:
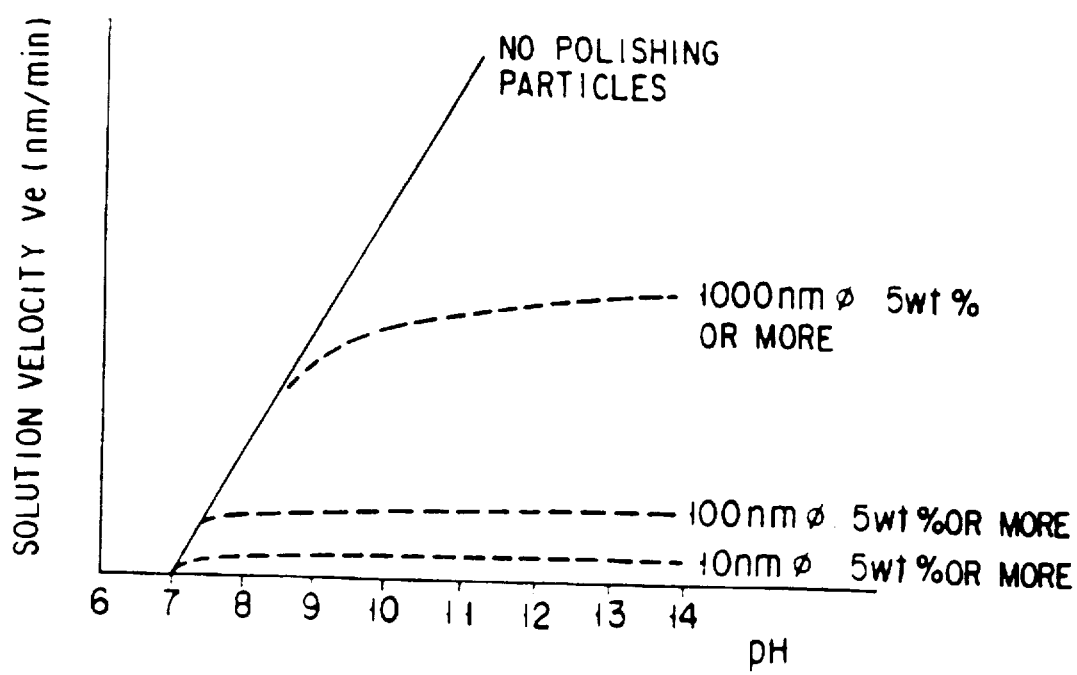
FIG. 9 is a graph showing plots of the relationship between the dissolution velocity and the pH for different mean particle sizes of polishing particles.
Figure 10:
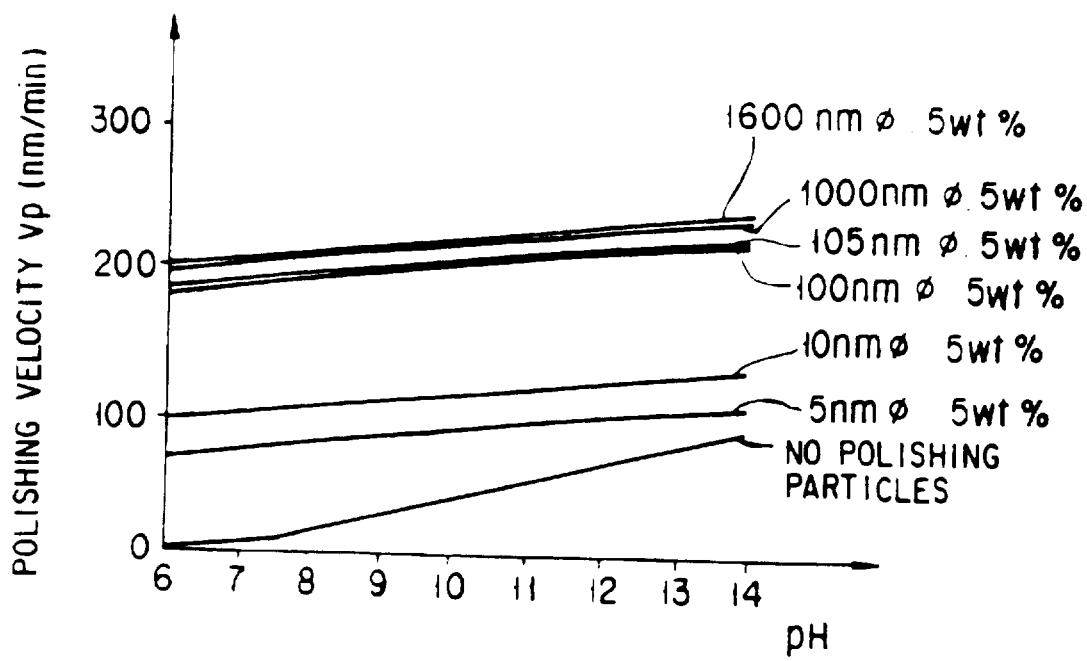
FIG. 10 is a graph showing plots of the relationship between the polishing velocity and the pH for different mean particle sizes of polishing particles.

FIG. 9 is a graph showing the relationship between the pH of the polishing solution and the dissolution velocity. Referring to FIG. 9, a solid line indicates an aqueous amine polishing solution containing no polishing particles ($SiO_2$), and each dotted line indicates a polishing solution prepared by dispersing polishing particles in an aqueous amine solution. FIG. 10 is a graph showing the relationship between the pH of the polishing solution and the polishing velocity $V_P$. As can be seen from FIG. 9, the dissolution velocity $V_E$ decreases abruptly when the polishing particles are dispersed in the aqueous amine solution. Especially when the particle size $\phi$ of the polishing particles is 100 nm or less, the dissolution velocity $V_E$ is stable at 2 nm/min or less. In addition, as is apparent from FIG. 10, the polishing velocity $V_P$ increases in proportion to the particle size $\phi$ and the pH. If the particle size $\phi$ becomes 100 nm or larger, however, the increase in the polishing velocity with respect to the increase in the particle size $\phi$ becomes small.

In polishing the object to be polished illustrated in FIG. 3, the value of $V_P/V_E$ must be 90 or more from a practical viewpoint. This is so because the height of the Al film 24a as a projecting portion generally ranges between 1 and 1.8 μm, whereas an allowable dishing amount of the Al film 24 as an interconnection must be 20 nm or less in order to prevent an increase in resistance or a decrease in reliability (e.g., an electromigration resistance). When this point is taken into account, the range of the particle size of the polishing particles and the pH range of the polishing solution over which a maximum surface roughness $R_{max}$ of 20 nm or less and a $V_P/V_E$ of 90 or higher can be obtained are as follows.

As shown in FIG. 9, when the particle size is 100 nm and the pH is 7.5 to 14, the dissolution velocity $V_E$ is 2 (pH 7.5) to 2.4 (pH 14). In addition, as shown in FIG. 10, when the particle size is 100 nm and the pH is 7.5 to 14, the polishing velocity $V_P$ is 180 (pH 7.5) to 220 (pH 14). That is, when the particle size is 100 nm and the pH is 7.5 to 14, the $V_P/V_E$ is 90 or higher. It is known that the increasing rate of the dissolution velocity $V_E$ with respect to the particle size is higher than that of the polishing velocity $V_P$ ($\Delta V_E > \Delta V_P$) at any instant over the pH range of 7.5 to 14. That is, if the particle size becomes greater than 100 nm, the $V_P/V_E$ within the pH range of 7.5 to 14 becomes lower than 90, so appropriate polishing can no longer be performed. Therefore, to decrease the maximum surface roughness $R_{max}$ to 20 nm or lower and to increase the $V_P/V_E$ to 90 or higher, it is preferable to set the particle size of the polishing particles at 100 nm or smaller and the pH of the polishing solution at 7.5 or higher. Of the polishing agents that are commercially available currently, those with the highest particle size accuracy have an error of ±5% for, e.g., a particle size of 100 nm. Therefore, although the particle size is defined to be 100 nm or less, an error (95 to 105 nm) of the particle size must be taken into consideration as a true value. Also, FIGS. 9 and 10 show the results obtained when the weight ratio of the polishing particles with respect to the whole polishing agent was 5%. If the weight ratio is higher than 5%, e.g., 10 to 30% which is used in regular polishing, the number of polishing particles per unit area increases, so dishing is naturally discouraged.

The present inventors performed polishing in the same fashion as mentioned earlier by using an object to be polished formed by omitting the carbon film 23 from the structure shown in FIG. 3, and found the following. That is, no problem arose although the polishing proceeded slightly to the underlying SiO$_2$ film 22 because of the absence of the carbon film 23. In this case, however, since the polishing velocity of the SiO$_2$ film is higher than that of the polishing-resistant film consisting of, e.g., carbon, the polishing amounts of both Al and SiO$_2$ must be controlled to some proper values. This can be done even if the object to be polished has no polishing-resistant film, but the polishing conditions must be strictly defined in that case. When the polishing velocities of Al, carbon, and SiO$_2$ were actually compared at pH 11, it was found, as shown in FIG. 11, that carbon was superior to SiO$_2$ as the material of the polishing-resistant film. However, if a polishing solution containing KOH or NaOH as a pH adjusting agent is used, the polishing velocity of SiO$_2$ increases to 100 nm/min or higher, and this further decreases the selectivity of Al to SiO$_2$. Consequently, a polishing-resistant film such as the carbon film 23 is required. It is also possible to use, instead of the carbon film 23, a film consisting of any of TiN, ZrN, HfN, TaN, VN, NbN, and TiW as the polishing-resistant film against aluminum polishing.

Figure 12A:
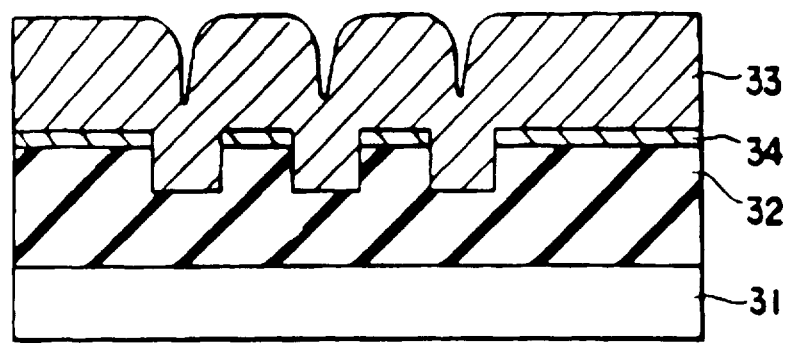
FIGS. 12A and 12B are sectional views for explaining another example of the polishing method of Embodiment 1.
Figure 12B:
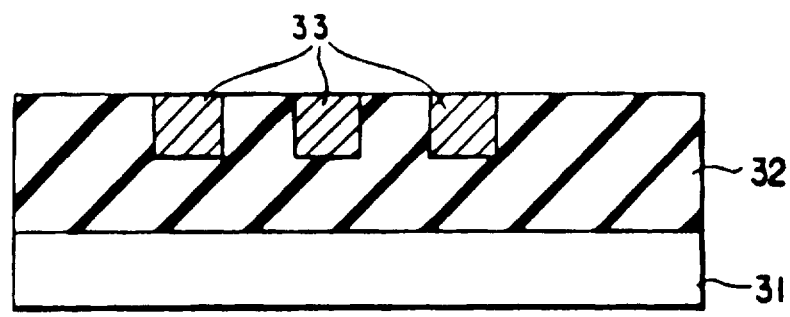

FIGS. 12A and 12B are sectional views for explaining the fabrication steps in another embodiment of the polishing method of Embodiment 1. First, as shown in FIG. 12A, an SiO$_2$ film 32 was formed on a silicon substrate 31. Subsequently, a 50-nm thick carbon film 34 was formed on the entire surface of the SiO$_2$ film 32 by DC magnetron sputtering. Thereafter, trenches for forming interconnections were formed by a normal photolithography process. An Al film 33 was then formed on the entire surface by the DC magnetron sputtering. This Al film 33 was so formed as to have a thickness of 450 nm which was larger than the thickness of the steps of the SiO$_2$ film 32. Subsequently, as shown in FIG. 12B, polishing was performed for the Al film 33 so that the Al film 33 was left behind in only the trenches. As mentioned earlier, this polishing was performed by setting the particle size of polishing particles at 100 nm or less and the pH of a polishing solution at 7.5 or more. Also, the polishing solution and the polishing apparatus used were those explained above.

When the polished surface after the polishing was observed by using an optical microscope and an SEM, it was found that the Al film 33 in a region except for the trenches was completely removed. In addition, neither flaws nor roughness caused by the polishing was observed on the surface of the Al film 33 left behind in the trenches. It was also found from the sectional observation by the SEM that almost no decrease was caused in the film thickness of the Al film 33 in the trenches, i.e., no dishing took place. In the above embodiment, colloidal silica prepared by dispersing SiO$_2$ particles as polishing particles in an aqueous piperazine solution was used as the polishing solution. It was, however, found that the abrupt decrease in the Al dissolution velocity occurring when the polishing particles were added to an aqueous alkaline solution was conspicuous particularly for silica particles. It was also found that for particles of, e.g., cerium oxide, titanium oxide, and alumina, although the dissolution velocity decreased by practical level, no such abrupt change as in the case of silica particles took place. Therefore, particles of these substances are also usable.

The mechanisms of these phenomena can be considered as follows. That is, when silica particles are dispersed in an aqueous alkaline solution as in this embodiment, the surface of each silica particle is charged negatively. Therefore, the silica particles are attracted to a local anode on the surface of aluminum, forming an electric double layer. This consequently discourages the dissolution of aluminum. Silicate ions such as SiO$_4^{4-}$ ions or (SiO$_3$)$_n$$^{m-}$ (m, n: whole number), for example (SiO$_3^{2-}$)n ions are produced as negative ions by reacting the silica particles with the aqueous alkaline solution. The dissolution of aluminum is discouraged by adsorbing the negative ions to a locally anode in a surface of aluminum. That is, the silica particles serve as a corrosion inhibitor for aluminum. For this reason, the alkaline silica dispersion of the present invention can polish Al without causing flaws and dishing. As an example, when Al was polished with a polishing agent prepared by dispersing alumina particles (particle size 50 nm) in an aqueous piperazine solution (pH 11), although the R$_{max}$ was within 20 nm, it was difficult to form Al buried interconnections since dishing was large.

When particles of, e.g., any of cerium oxide, titanium oxide, and alumina, other than silica, are dispersed in an aqueous alkaline solution, the decrease in the Al dissolution velocity is not so conspicuous as that when silica particles are used as mentioned earlier. However, by adding to this aqueous solution a predetermined amount of silica particles, the ratio of the dissolution velocity to the Al polishing velocity can be decreased sufficiently. In this case, the effect of the present invention can be achieved by dispersing particles of cerium oxide, titanium oxide, or alumina with a particle size of 100 nm or smaller in an aqueous solution with a pH higher than 7.5, and by adding silica particles with a particle size of 100 nm or smaller to the resultant solution.

An embodiment of polishing of Al using a mixture of alumina particles and silica particles will be described below. A polishing solution was prepared by dispersing 10.0 wt % of alumina particles with a particle size of 50 nm and 1.0 wt % of silica particles with a particle size of 50 nm in an aqueous piperazine solution having a pH of 11.0. The polishing apparatus and the object to be polished used were those shown in FIGS. 2 and 12A, respectively. As a result of the polishing, as in the above embodiment, neither flaws nor dishing was found on the Al surface, and the sectional shape as shown in FIG. 12B was obtained. The R$_{max}$ on the Al surface was 9 to 10 nm. Similar experiments were conducted by using particles of titanium oxide and cerium oxide with a particle size of 50 nm instead of the alumina particles. Consequently, it was possible to obtain effects identical with those described above. It was also confirmed that in addition to the particles of alumina, titanium oxide, and cerium oxide, particles of diamond, silicon carbide, and zirconium oxide were also effective if they were used in the form of a mixture with silica particles.

As the substance for adjusting the pH, it is possible to use, e.g., amines such as triethylamine, choline, and TMAH, and ammonia, in place of piperazine. In addition, even if particles of a substance other than silica are used, the Al dissolution velocity can be extremely decreased by adding a substance generally known as a corrosion inhibitor for Al.

Although the corrosion inhibitor for Al that can be used changes depending on whether the solution is acidic or alkaline, known examples are silicates, chromates, amines, glucose, tragacanth (tragarith) gum, and agar. The present inventors have made extensive studies and found that when the polishing solution was alkaline, it was possible to obtain a good characteristic, i.e., a decrease in the Al dissolution velocity by at least silica particles, silicates, glucose, and agar. In addition, when these corrosion inhibitors were added to a polishing agent prepared by dispersing alumina particles (particle size 50 nm) an aqueous piperazine solution (pH 11) and Al was polished by using each resultant polishing agent, it was confirmed that the $R_{max}$ was within 20 nm and at the same time dishing was suppressed.

The above embodiment has been described by taking the Al film as an example of the object to be polished. However, it is also possible to use, e.g., an Al alloy film containing Al as its main constituent and a small amount of Cu or Si as the object to be polished. In addition, if a material formed by mixing in a polishing agent polishing particles, a corrosion inhibitor for discouraging elution of a metal, and a chemical component for dissolving a metal is used, a film consisting of Cu or a Cu alloy or Ag or an Ag alloy can be used as the object to be polished. Furthermore, in the present invention, recessed portions can have different widths in different locations. In addition to these modifications, various other modifications of the present invention can be made without departing from the gist of the invention.

Embodiment 2

In a polishing process, the residue of polishing particles after polishing (CMP) presents a big problem, since the residual polishing particles cause defects of semiconductor devices. It is therefore necessary to perfectly remove the polishing particles after the CMP.

Conventional methods of removing the polishing particles after the CMP are washing with pure water, scrubbing using a sponge scrubber or a brush scrubber, ultrasonic cleaning, and chemical cleaning using a solution mixture of sulfuric acid and hydrogen peroxide water. However, none of these cleaning methods can remove the polishing particles completely. The present inventors performed CMP for an $SiO_2$ film formed on a 6-inch Si wafer by using a polishing agent prepared by dispersing cerium oxide particles as polishing particles in pure water, and then performed scrubbing (cleaning 1) using a brush scrubber or cleaning (cleaning 2) which was a combination of scrubbing and chemical cleaning using a solution mixture of sulfuric acid and hydrogen peroxide water. Table 1 below shows the measurement results of the numbers of residual particles for different particle sizes.

TABLE 1

| Particle size (μm) of residual particles | Number of residual particles | | | |
|---|---|---|---|---|
| | –0.3 | 0.3–0.5 | 0.5–1.0 | 1.0– |
| Before CMP | 9 | 3 | 1 | 1 |
| After CMP | 14997 | 14435 | 2020 | 40 |
| After cleaning 1 | 1336 | 1319 | 14 | 4 |
| After cleaning 2 | 468 | 442 | 10 | 3 |

As is apparent from Table 1, the number of residual polishing particles after the CMP is larger than that before the CMP regardless of the particle size. The minimum processing size of an LSI has already entered a sub-halfmicron generation, so the level of a dust number required has become stricter. When these situations are taken into account, it is clear that even residual particles with a particle size of 0.3 μm or smaller have a large effect on the yield of products. Therefore, none conventional polishing method using conventional polishing particles can meet the requirements for the fabrication of LSIs of the next generation.

In this embodiment, therefore, a method capable of polishing without causing dishing and the like by minimizing the amount of residual polishing particles after the polishing, thereby performing planarization of films and formation of buried metal interconnections well will be described.

The present inventors have made extensive studies to solve the above conventional problems and found that the amount of residual polishing particles after polishing can be minimized by using, as polishing particles, particles consisting of an organic polymer compound that has not been used in conventional polishing processes or particles containing at least carbon as a main constituent, and this makes it possible to perform polishing without causing dishing and the like.

That is, this embodiment provides a polishing method comprising the step of polishing a film to be polished by using particles consisting of an organic polymer compound or particles containing at least carbon as a main constituent, as polishing particles. In this embodiment, it is preferable that the method further comprise the step of removing the polishing particles by incinerating them after the polishing.

Examples of the organic polymer compound are a methacrylic resin such as PMMA, a phenolic resin having a hardness equivalent to that of the methacrylic resin, a urea resin, a melamine resin, a polystyrene resin, a polyacetal resin, and a polycarbonate resin. Examples of the material containing at least carbon as its main constituent are amorphous carbon, emery, and carbon black in which graphite structure units each having one or more layers are randomly combined.

The polishing particles described above are preferably spherical. This spherical shape includes a substantially spherical shape having no sharp pointed portions. The spherical shape can discourage a mechanical action during polishing, thereby preventing the surface of a film to be polished from being damaged or roughened. The mean particle size of the polishing particles is preferably 0.01 to 0.1 μm. This is so because if the mean particle size of the polishing particles is smaller than 0.01 μm, the particles readily flocculate to increase the surface roughness and to make the polishing velocity unstable. If the mean particle size is greater than 0.1 μm, the surface roughness increases, and the dishing amount also increases in proportion to the particle size.

As the method of incinerating the polishing particles after the polishing, it is possible to use a plasma incineration treatment of exposing to an oxygen plasma or supplying oxygen radicals downflow, and a high-temperature treatment in an oxygen atmosphere. The polishing particles can be removed easily by these methods.

Examples of the film to be polished are a pure Al film, a film consisting an alloy containing Al as its main constituent such as an AlSiCu alloy and an AlCu alloy, a silicon oxide film, a silicon nitride film, an amorphous silicon film, a polycrystalline silicon film, and a single-crystal silicon film The film to be polished, the polishing particles, and the solution for dispersing the polishing particles must be properly selected in association with each other by taking the hardness or the chemical etching action into account. For example, in situations where the solution for dispersing the polishing particles is preferably alkaline, a film consisting of pure Al, an AlSiCu alloy, or an AlCu alloy is used as the film to be polished, and organic polymer compound particles or carbon black particles are used as the polishing particles. In cases in which the solution is preferably acidic, a film containing Cu as its main constituent is used as the film to be polished, and organic polymer compound particles are used as the polishing particles.

The polishing method of this embodiment is characterized by comprising the step of polishing a film to be polished by using spherical particles composed of an organic polymer compound or particles containing at least carbon as a main constituent, as polishing particles. Since the polishing particles are spherical, the resulting mechanical action is small. The prevents the surface of the film to be polished from being damaged or dished during CMP. In addition, the polishing particles can be removed completely from the film to be polished by incineration, leading to no defects of semiconductor devices, such as a decrease in reliability or in product yield, resulting from the residue of the polishing particles. The combination of above polishing apparatus and an ashing apparatus may be used in a case of performing the polishing and the incineration by using above polishing particles.

(Example 1)

Figure 13:
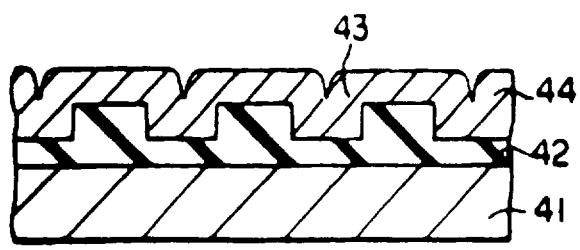
FIG. 13 is a sectional view for explaining one example of a polishing method of Embodiment 2.

First, as shown in FIG. 13, an $SiO_2$ film 42 was formed on a silicon substrate 41, and 0.4- to 10-μm wide, 0.4-||m deep trenches 43 for forming interconnections were formed by normal photolithography and etching processes. Subsequently, a 4,500-Å thick Al film 44 was formed on the entire surface without heating in an Ar atmosphere at a pressure of $10^{-4}$ Torr by using a DC magnetron sputtering process. In this manner, a sample was fabricated. The number of residual polishing particles on the surface of the sample was measured by using a dust counter. The result is given in Table 2 below.

Subsequently, CMP was performed for this sample by using the apparatus shown in FIG. 2. Note that a polishing pad made of foam polyurethane was used as a polishing pad 13. In this CMP, a slurry prepared by dispersing 10.0 wt % of PMMA (polymethylmethacrylate) particles with a mean particle size of 1,000 Å in an aqueous alkaline solution with a pH of about 10 was used as a polishing agent. Ammonium polycarboxylate was used as the dispersant. The polishing pressure was 300 gf/cm$^2$, and the rotating speeds of a turntable and a sample holder were 100 rpm. As a result, it was possible to leave Al nearly completely in the trenches 43 shown in FIG. 13. In addition, almost no flaws were found on the surface of the Al interconnection. Note that the polishing velocity of Al was $V_{Al}=150$ Å/min. The number of residual polishing particles on the surface of the sample after the CMP was measured in the same manner as described above. The result is also shown in Table 2 below.

Subsequently, the sample subjected to the CMP was washed with pure water by using a sponge and dried. The number of residual polishing particles on the surface of the sample was also measured similarly. The result is given in Table 2 below. Furthermore, an incineration treatment was performed for the sample at a plasma output of 500 W and an $O_2$ partial pressure of 0.9 Torr, thereby removing the residual polishing particles. The number of polishing particles remaining on the sample surface was measured in the same fashion as mentioned earlier. The result is also given in Table 2 below. All values given in Table 2 are mean values per wafer.

TABLE 2

| Particle size (μm) of residual particles | Number of residual particles | | | |
|---|---|---|---|---|
| | –0.3 | 0.3–0.5 | 0.5–1.0 | 1.0– |
| Before CMP | 8 | 3 | 1 | 1 |
| After CMP | 14610 | 14487 | 2148 | 44 |
| After sponge cleaning | 222 | 104 | 12 | 6 |
| After incineration treatment | 19 | 12 | 2 | 1 |

As can be seen from Table 2, it was possible to almost completely remove the residual polishing particles from the surface of the sample when the sample was subjected to the incineration. Most particles counted on the surface of the sample after the incineration are assumed to be dust particles or projections and recesses on the sample surface rather than the polishing particles. When CMP was performed by using a slurry prepared by dispersing PMMA particles in pure water of pH 7, Al was not at all polished. That is, the Al polishing velocity of the polishing agent prepared by dispersing PMMA particles in pure water was $V_{Al}=0$ Å/min at a polishing pressure of 10 to 1,000 gf/cm$^2$. This result demonstrates that when PMMA particles are to be used in polishing of Al, the solution of the polishing agent must be rendered either acidic or alkaline so that a chemical etching action proceeds. By the addition of the chemical etching action, a practical polishing velocity can be obtained. To raise the polishing velocity by adding the chemical etching action and at the same time prevent the Al surface from being damaged, it is particularly desirable that the dispersing solution be alkaline.

Figure 14:
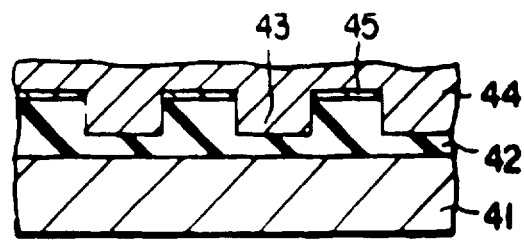

In this embodiment, the sample having the structure shown in FIG. 13 is used. However, a sample having a structure as shown in FIG. 14 is also usable. This structure was formed as follows. First, an $SiO_2$ film 42 was formed on a silicon substrate 41, and a 500-Å thick carbon film 45 as a polishing-resistant film was formed on the film 42 in an Ar atmosphere at a pressure of $10^{-4}$ Torr by a DC magnetron sputtering process. Subsequently, trenches 43 for forming interconnections were formed to have dimensions similar to those of the trenches shown in FIG. 13 by regular photolithography and etching processes. Thereafter, while the resultant sample was heated at 500° C., a 4,000-Å thick Al film 44 was formed in an Ar atmosphere at a pressure of $10^{-4}$ Torr by the DC magnetron sputtering process. It was found that effects identical with those discussed earlier could be obtained by the sample having this structure. That is, according to the method of the present invention, it is possible to remove the polishing particles nearly completely regardless of the presence/absence of the polishing-resistant film or regardless of the surface shape of the film to be polished. Note that the carbon film 45 can be removed at the same time when the polishing particles are removed by the incineration treatment using an oxygen plasma in the same fashion as in Embodiment 1, resulting in a decreased number of fabrication steps.

(Example 2)

Figure 15:
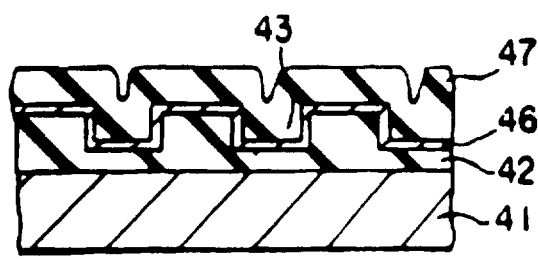

As shown in FIG. 15, an $SiO_2$ film 42 was formed on a silicon substrate 41, and trenches 43 for forming interconnections were formed to have dimensions identical with those of the trenches shown in FIG. 13 by conventional photolithography and etching processes. Subsequently, a 500-Å thick Nb film 46 was formed on the entire surface in an Ar atmosphere at a pressure of $10^{-4}$ Torr by using a DC magnetron sputtering process. On the entire surface of the film 46, a $CuO_x$ (x=0 to 0.5) film 47 about 4,000 Å in thickness was formed in an $Ar$—$O_2$ gas mixture atmosphere at a pressure of $10^{-4}$ Torr by using a reactive ion sputtering process. In this manner, a sample was fabricated.

CMP was performed for the resultant sample under polishing conditions identical with those in Example 1. Note that a material prepared by dispersing 10.0 wt % of PMMA particles with a mean particle size of 1,000 Å in an aqueous acidic solution with a pH of about 3 was used as a polishing agent. As a result, when the rotating speeds of a turntable and a sample holder were 100 rpm and the polishing pressure was 300 gf/cm$^2$, the polishing velocity of the $CuO_x$ film 47 was 200 to 250 Å/min, which was slightly higher than that of Al. After the CMP, the sample was cleaned by using a sponge and subjected to an incineration treatment performed under the same conditions as in Practical Example 1 by using an oxygen plasma. The result was that the polishing particles remaining on the sample surface were perfectly removed.

This example reveals that when a $CuO_x$ film is to be polished by using PMMA particles as a polishing agent, a solution for dispersing the PMMA particles is preferably an aqueous acidic solution of about pH 3 containing an ammonium salt or a solution containing an ion which forms a complex ion or a chelate compound together with copper, in order to raise the polishing velocity by adding a chemical etching action.

(Example 3)

Figure 16:
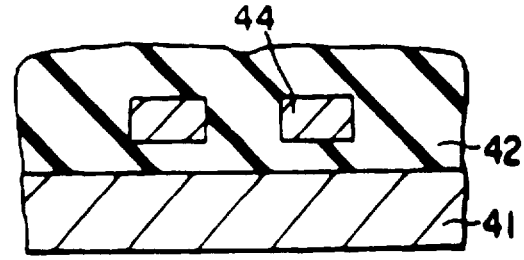

As shown in FIG. 16, an $SiO_2$ film 42 was formed to have a thickness of 5,000 Å on a silicon substrate 41. On this $SiO_2$ film 42, a 4,000-Å thick Al film 44 and a 500-Å thick carbon film 45 were formed in this order. Subsequently, normal photolithography and etching processes were performed to form Al interconnections such that the carbon film 45 was left behind on only the upper surface. Thereafter, another $SiO_2$ film 42 was formed to have a thickness of 4,500 Å by a plasma CVD process. In this manner, a sample having a structure in which the Al interconnections were embedded in the $SiO_2$ film was fabricated. CMP was performed for this sample under polishing conditions similar to those in Example 1. Note that a material prepared by dispersing 1.0 wt % of amorphous carbon particles with a mean particle size of 0.5 μm in pure water was used as a polishing agent. In this preparation of the polishing agent, ammonium polycarboxylate was used as the dispersant. As a result, it was possible to leave the $SiO_2$ film 42 behind between the Al interconnections and to completely remove the $SiO_2$ film 42 from the carbon film 45. Note that the polishing velocity of the $SiO_2$ film 42 was approximately 2,000 Å/min when the rotating speeds of a turntable and a sample holder were 100 rpm and the polishing pressure was 300 gf/cm$^2$.

After the CMP, she resultant sample was cleaned by using a sponge and subjected to an incineration treatment using an oxygen plasma. Consequently, the residual polishing particles on the surface of the sample were completely removed. Note that the plasma output was 500 W and the $O_2$ partial pressure was 0.9 Torr. In this incineration treatment using an oxygen plasma, the carbon film on the Al interconnections 44 can be simultaneously removed, resulting in a decreased number of fabrication steps.

It is found from this example that when an $SiO_2$ film is to be polished by using amorphous carbon particles with a mean particle size of 0.5 μm as a polishing agent, a dispersing solution is preferably an aqueous alkali hydroxide solution in order to raise the polishing velocity by adding a chemical etching action.

(Example 4)

In this example, the method of the present invention is applied to the step of isolating buried elements. First, as shown in FIG. 17A, trenches 48 for isolating buried elements were formed to have a depth of 0.8 μm and a width of 0.35 μm in a silicon substrate 41 by normal photolithography and etching processes. Thereafter, a 0.8-μm thick $SiO_2$ film 42 was formed to bury the trenches 48 by a CVD process using TEOS gas and $O_2$ gas. In this manner, a sample was fabricated. Subsequently, as shown in FIG. 17B, CMP was performed for the sample following the same procedures as in Example 3. Thereafter, as shown in FIG. 17C, a heat treatment was performed for the sample in an oxygen atmosphere at the atmospheric pressure and a temperature of 1,000° C. for 30 minutes, thereby completely removing polishing particles 49.

(Example 5)

In this example, organic polymer compound particles and particles of another substance are used together as polishing particles. The structure shown in FIG. 14 was used as a sample, and CMP was performed for the sample. A polishing agent was prepared by dispersing silica particles with a mean particle size of 350 Å in an aqueous alkaline solution of pH 11. When the rotating speeds of a turntable and a sample holder were 100 rpm and the polishing pressure was 300 gf/cm$^2$, the Al polishing velocity $V_{Al}$ of the polishing agent was 900 Å/min.

Subsequently, for the purpose of polishing the sample and at the same time removing the residual silica particles from the sample surface, polishing was performed on a turntable different from the above polishing table at a polishing pressure of 100 gf/cm$^2$ and rotating speeds of the turntable and the sample holder of 100 rpm for a polishing time of one minute by using a polishing agent prepared by dispersing PMMA particles with a mean particle size of 1,000 Å in an aqueous alkaline solution of pH 3.

Thereafter, the sample was subjected to an incineration treatment using an oxygen plasma under the same conditions as in Example 1. Consequently, it was possible to form Al interconnections on which neither the silica particles nor the PMMA particles remained. Note that the carbon film 45 can also be removed in the incineration treatment using an oxygen plasma. That is, even when a normal polishing agent is used, it is possible to obtain a practical polishing velocity and to remove the residual polishing particles easily.

(Comparative Example 1)

CMP was performed following the same procedures as in Example 3 except that diamond particles with a mean particle size of 0.5 μm were used as polishing particles. Consequently, it was possible to remove the polishing particles by sponge cleaning and a heat treatment in an oxygen atmosphere performed after the CMP. However, a large number of flaws were formed on the surface of an $SiO_2$ film of the sample, and a surface roughness $R_a$ became about 2,600 Å, indicating that the surface was roughened extremely. The reason for this can be assumed that the corrected Mohs hardness of the diamond particles is 15 which is larger than the corrected Mohs hardness of 8 of the $SiO_2$ film, and that the particle shape is uneven and is not spherical.

It is found from this comparative example that diamond particles are inadequate in respect of the surface roughness and the occurrence of flaws on the surface.

As has been described above, the polishing method of this embodiment polishes a film to be polished by using spherical particles consisting of an organic polymer compound or particles containing at least carbon as a main constituent, as polishing particles. Therefore, it is possible to minimize the amount of the residual polishing particles after the polishing and to perform the polishing without causing dishing and the like. This makes it possible to perform planarization of films and formation of buried metal interconnections with a high reliability and a high yield.

Embodiment 3

In CMP, fine polishing particles entering portions including fine interconnections on the submicron order or small steps in trenches cannot be removed sufficiently by the washing with water and/or scrubbing described above. For this reason, polishing particles unavoidably remain on metal interconnections. Therefore, to planarize films and form metal interconnections with a high quality and a high reliability, it is essential to reduce flaws, dishing, and the residue of polishing particles taking place on the surface of a film to be polished after CMP.

In this embodiment, therefore, a method capable of performing planarization of films and formation of buried metal interconnections well by sufficiently removing residual polishing particles after CMP will be described.

This embodiment provides a polishing method comprising the steps of forming a polishing-resistant film consisting of a material with a polishing velocity lower than that of the material of a film to be polished in at least projecting portions of a substrate having the projecting portions and recessed portions, forming the film to be polished on the polishing-resistant film, and polishing the film to be polished by using a polishing agent containing polishing particles with a particle size smaller than the thickness of the polishing-resistant film.

The projecting and recessed portions mean projections and recesses such as those formed when trenches for interconnections or openings for connecting lines are formed in a substrate. Examples of the polishing particles for use in this embodiment are silica particles, cerium oxide particles, zirconium oxide particles, alumina particles, titanium oxide particles, silicon carbide particles, diamond particles, and graphite particles.

Examples of the material of the polishing-resistant film for use in this embodiment are carbon, Si, $SiO_2$, SiN, Ti, $TiSi_x$, W, Nb, $WSi_x$, and $MoSi_x$. Note that the material of the polishing-resistant film is chosen from materials each having a polishing velocity lower than that of the material of the film to be polished with respect to polishing particles used in polishing. Therefore, it is necessary to properly select the combination of the material of the polishing-resistant film, the material of the film to be polished, and the polishing particles so as to meet the above condition. An example is a combination of carbon as the material of the polishing-resistant film, Al as the material of the film to be polished, and silica particles as the polishing particles.

Figure 18A:
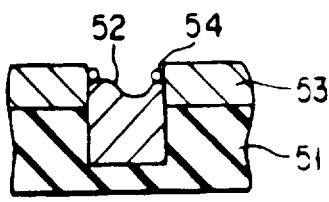
FIGS. 18A and 18B are sectional views for explaining the lower limit of the ratio of the mean particle size of polishing particles/the thickness of a polishing-resistant film.
Figure 18B:
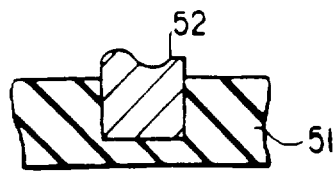

The particle size of the polishing particles used in this embodiment is set to be smaller than the thickness of the polishing-resistant film for the reason explained below. That is, since the film to be polished is polished more easily than the polishing-resistant film during polishing, polishing particles penetrate into the film to be polished under the influence of a pressure. As a result, the polishing proceeds excessively. The penetration amount of the polishing particles, i.e., the dishing amount increases as the particle size increases. Therefore, the particle size is set as described above in order to reduce the dishing amount to about the thickness of the polishing-resistant film. Assume, as shown in FIG. 18A, that an interconnection metal 52 is buried in a recessed portion of an insulting film 51, and a polishing-resistant film 53 is formed on a projecting portion of the insulating film 51. In this case, if the particle size of polishing particles 54 is extremely smaller than the thickness of the polishing-resistant film 53, portions where the polishing particles 54 and the interconnection metal 52 are in contact with each other are difficult to polish during polishing. Therefore, as shown in FIG. 18B, the interconnection metal 52 projects from the surface of the insulating film 51 when the polishing-resistant film 53 is removed after the polishing. This is very unpreferable in respect of planarization. For this reason, the particle size of the polishing particles must be so set as to meet the condition that particle size/thickness of polishing-resistant film $\geq 0.3$. Note that the particle size means a mean particle size, and it is most preferable that the polishing particles have a particle size distribution in which the weight of particles having particle sizes twice or less the mean particle size is 80 % or more of the weight of all polishing particles.

The polishing method of this embodiment is characterized in that a polishing-resistant film composed of a material with a polishing velocity lower than that of a film to be polished is formed on at least projecting portions of a substrate having the projecting portions and recessed portions, and the film to be polished is formed on the polishing-resistant film and polished by using a polishing agent containing polishing particles with a particle size smaller than the thickness of the polishing-resistant film.

The polishing particle with the particle size smaller than the thickness of the polishing-resistant film polish the film to be polished by a thickness corresponding to that particle size. Since, however, a pressure hardly acts on the polishing particles because of the presence of the polishing-resistant film, the particles do not polish the film to be polished any further. Therefore, the film to be polished is prevented from being polished to a position below the position of the lower surface of the polishing-resistant film. This makes it possible to prevent flaws and roughness on the surface, the occurrence of dishing, and the embedding of polishing particles, which are problems when a film to be polished consisting of a low-hardness material is polished. In addition, all polishing particles that are not removed by cleaning after CMP are exposed to the surface when the polishing-resistant film is removed. Therefore, these residual particles can be readily removed by a subsequent cleaning.

(Example 6)

Figure 19:
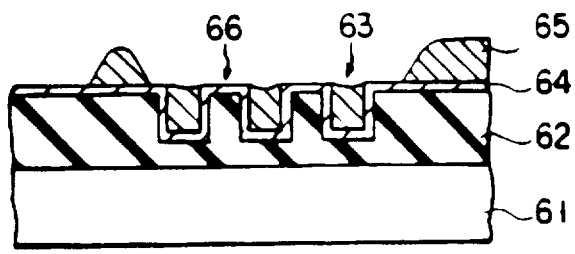
FIG. 19 is a sectional view showing an example of an object to be polished by the polishing method of Embodiment 3.

First, as shown in FIG. 19, an $SiO_2$ film 62 was formed on a silicon substrate 61, and interconnection formation trenches 63 each 0.4 to 10 μm in width and 0.4 μm in depth were formed by regular photolithography and etching processes. Subsequently, a 500-Å thick carbon film 64 was formed on the entire surface by DC magnetron sputtering. On the entire surface of this carbon film 64, a 4,000-Å thick Al film 65 was formed without heating in an Ar atmosphere at a pressure of $10^{-4}$ Torr by using the DC magnetron sputtering. Thereafter, a heat treatment was performed for the Al film 65 in a vacuum (e.g., a pressure of $10^{-6}$ Torr), thereby flocculating and burying the Al film 65 while suppressing formation of a natural oxide film on the surface of the Al film 65. The temperature of the heat treatment was, e.g., 600° C. As a result, Al changed into a single crystal, and the Al film 65 was buried in the trenches 63 and left behind on projecting portions in the form of islands. In this manner, a sample was fabricated.

CMP was then performed for the resultant sample by using the apparatus shown in FIG. 2. Note that a foam polyurethane polishing pad having a sueded surface was used as a polishing pad 13. The polishing agent used in this CMP was prepared by dispersing silica particles with a particle size of 500 Å, at a ratio of 10 wt % with respect to the total weight, in a dilute aqueous solution of piperazine ($C_4H_{10}N_2$) with pH 11. This is so because, as polishing particles suitable for CMP for forming metal buried interconnections, those having a particle size of 1,000 Å or less are favorable in respect of planarization. The polishing conditions were a polishing pressure of 50 to 300 gf/cm$^2$, a turntable rotating speed of 50 to 500 rpm, and a polishing agent supply amount of 300 cc/min.

In this CMP, the polishing velocity $V_{Al}$ of the Al film and the polishing velocity $V_C$ of the carbon film were 830 Å/min and 0 Å/min, respectively. This indicates that the carbon film functioned as a polishing-resistant film nearly perfectly. That is, when the entire surface of the carbon film 64 was exposed, the polishing did not proceed any further on projecting portions 66. However, in the trenches 63 in which the upper surface of the Al film 65 was exposed, the polishing proceeded because the polishing velocity of Al was higher than that of carbon. Since the carbon film 64 existed on the projecting portions 66, the pressure from the polishing pad 13 became hard to be applied to polishing particles 67 at the time the polishing proceeded from the upper surface of the carbon film 64 to a depth of about the size of the outer diameter of the polishing particles. Consequently, the polishing stopped. At that time, the surface of the Al film 65 buried in the trenches 63 was on nearly the same level as the lower surface of the carbon film 64 as the polishing-resistant film.

Figure 20A:
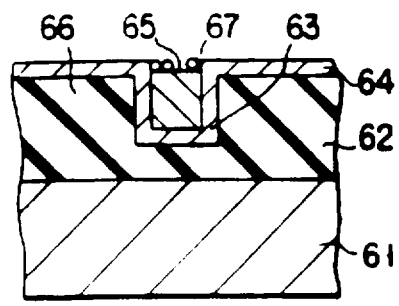
FIGS. 20A to 20C are sectional views for explaining fabrication steps in the polishing method of Embodiment 3.

After the CMP, the sample was subjected to washing with pure water, scrubbing using a PVA (polyvinyl alcohol) fabric, and ultrasonic cleaning (first cleaning). The section of the resultant sample is shown in FIG. 20A. The presence/absence of polishing particles remaining on the sample was checked by using a dust checker and an SEM (Scanning Electron Microscope). As a result, as shown in FIG. 20A, no polishing particles 67 were present on the carbon film 64 on the projecting portions 66, and a slight amount of the polishing particles 67 was found on the Al film 65 buried in the trenches 63.

Figure 20B:
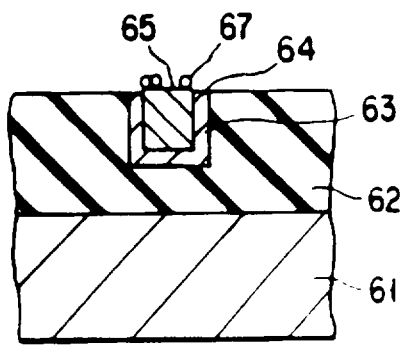

Subsequently, an incineration treatment using an oxygen plasma was performed for the sample at an oxygen partial pressure of 0.9 Torr and a plasma output of 500 W, thereby removing the carbon film 64 formed on the projecting portions 66. The section of the incinerated sample is illustrated in FIG. 20B. As shown in FIG. 20B, the surface of the exposed SiO$_2$ film 62 was almost leveled with the surface of the Al film 65. The reason for this can be assumed that the carbon film 64 was readily etched when exposed to the oxygen plasma, but Al was not etched because it was protected by a natural oxide film formed on its surface.

Figure 20C:
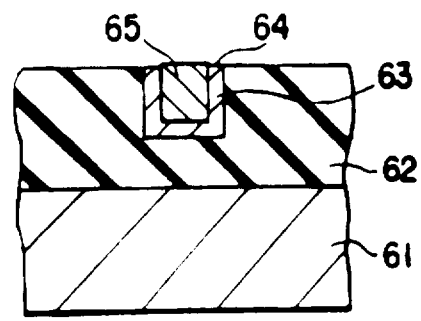

The resultant sample was then subjected to washing with pure water, scrubbing using PVA fabric, and ultrasonic cleaning (second cleaning), thereby removing the polishing particles 67 remaining on the Al film 65. The presence/absence of the residual polishing particles on the sample in this state was checked by using the dust checker and the SEM. The result was that, as shown in FIG. 20C, the polishing particles 67 left behind on the Al film 65 were nearly perfectly removed. The reason for this can be assumed that because the carbon film 64 was removed from the projecting portions 66 after the CMP, only the polishing particles 67 projected from the substrate surface, and this facilitated the removal of the particles through a mechanical process. In addition, neither flaws nor dishing was found on the surface of the Al film buried in the trenches 63.

Figure 21:
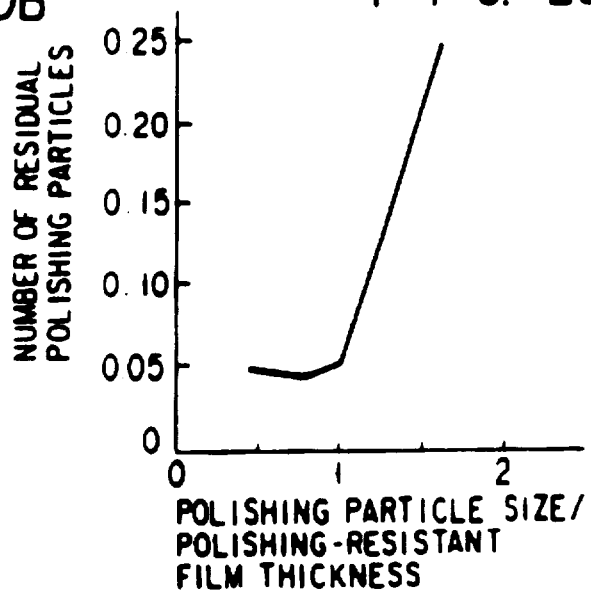
FIG. 21 is a graph showing the relationship between the ratio of the mean particle size of polishing particles/the thickness of a polishing-resistant film and the number of residual polishing particles.

Separately, the CMP and the incineration treatment were performed for the sample shown in FIG. 19 following the same procedures as described above by changing the polishing particle size/polishing-resistant film thickness ratio by altering the particle size of the SiO$_2$ particles as the polishing particles to 200 to 750 Å, while the thickness of the carbon film 64 as the polishing-resistant film was fixed at 500 Å, thereby removing the carbon film 64. Thereafter, the polishing particles were removed by cleaning. The number of polishing particles with a particle size of 0.2 μm or more which remained on the surface of each resultant sample after the second cleaning was measured by using the dust counter. The result is shown in FIG. 21. Note that the width of interconnection formation trenches of the sample was 0.4 μm. As is apparent from FIG. 21, when the particle size of the polishing particles is smaller than the thickness of the polishing-resistant film, i.e., when the polishing particle size/polishing-resistant film thickness ratio is smaller than 1, the number of residual polishing particles on the surface of the sample is very small. In this example, the number of residual polishing particles was 10 or less on average per 6-inch wafer after the polishing-resistant film was removed and the cleaning was done.

The above phenomenon was examined by setting the particle size of the polishing particles to be smaller than the thickness of the polishing-resistant film and changing the particle size within the range of 100 to 1,000 Å. As a result, the Al film 65 in the trenches 63 was polished from the upper surface of the polishing-resistant film to a depth of about the particle size of the polishing particles in every case. That is, it is found that when polishing particles having a particle size smaller than the thickness of a polishing-resistant film are used, the position of the upper surface of the Al film 65 formed becomes equal to or higher than the position of the lower surface of the polishing-resistant film. Therefore, the polishing particles can be removed stably by performing washing with water, scrubbing, and ultrasonic cleaning in this state.

In this example, a PVA fabric was used in the scrubbing. However, equivalent results could be obtained by using a sponge, a nylon brush, a fabric of foam polyurethane, and an unwoven fabric, instead of the PVA fabric.

(Example 7)

As shown in FIG. 22, an SiO$_2$ film 62 was formed on a silicon substrate 61, and a 500-Å thick carbon film 64 was formed on the entire surface by DC magnetron sputtering. Subsequently, interconnection formation trenches 63 with the same dimensions as those in Example 6 were formed by normal photolithography and etching processes. A 4,000-Å thick Al film 65 was then formed on the entire surface Of the resultant structure in an Ar atmosphere at a pressure of 10$^{-4}$ Torr by using the DC magnetron sputtering. In this case, as shown in FIG. 22, furrows were formed on the Al film when the temperature of the silicon substrate 61 was raised to, e.g., 500° C. In this manner, a sample was fabricated.

CMP was performed for the resultant sample following the same Procedures as in Example 6, thereby burying the A film 65 in the trenches 63, and removing the excess Al film from projecting portions 66. Thereafter, the resultant sample was subjected to first cleaning, incineration, and second cleaning following the same procedures as in Example 1. As a result, most polishing particles remaining on the surface of the sample could be removed.

Subsequently, the polishing time dependence of the dishing amount in this sample was checked. The dishing amount is, as shown in FIG. 23, a distance D from the position of the upper surface of the carbon film 64 to the position of a portion with the smallest thickness of the Al film 65. Note that the particle size of polishing particles 67 used was set at 500 and 1,000 Å, the thickness of the carbon film 64 as a polishing-resistant film was set at 500 A, and the width of the Al film 65 as a line width was set at 10 μm.

As shown in FIG. 24, the relationship between the dishing amount and the polishing time is such that the dishing amount is kept smaller than the film thickness when the particle size of the polishing particles is equal to the thickness (500 Å) of the polishing-resistant film. In addition, the dishing amount was still smaller than the film thickness even if the polishing time was twice that required for polishing away the Al film 65 completely. When the particle size of the polishing particles increases, the polishing velocity increases, and the dishing amount also increases. Furthermore, the increase (slope) in the dishing amount after the excess Al, film 65 is removed is larger than that when the particle size is 500 Å. When the dishing amount was checked by chancing the width of the Al film 65, the amount remained nearly the same for widths of 0.5 to 10 μm.

FIG. 25 shows the dishing amount of a 10-μm wide Al film when the particle size of polishing particles was changed while the thickness of a polishing-resistant film was fixed at 500 Å. As shown in FIG. 25, a point of inflection is present in the graph when the particle size of the polishing particles is the same as the thickness (500 Å) of the polishing-resistant film. For particle sizes below the inflection point, the dishing amount changes moderately below the thickness of the polishing-resistant film. For particle sizes above the inflection point, the increasing rate of the dishing amount increases to become nearly proportional to that of the particle size. It is found from FIGS. 24 and 25 that a startling effect of reducing the dishing amount can be expected when polishing is performed by using polishing particles having a particle size smaller than the thickness of a polishing-resistant film.

(Example 8)

As shown in FIG. 26, an $SiO_2$ film 62 was formed on a silicon substrate 61, and interconnection formation trenches 63 each 0.4 to 10 μm in width and 0.4 μm in depth were formed by normal photolithography and etching processes. Subsequently, a 500-Å thick polycrystalline silicon film 68 was formed on the entire surface by AC magnetron sputtering. Thereafter, a 4,000-Å thick Cu film 69 was formed on the entire surface in an Ar atmosphere at a pressure of $10^{-4}$ Torr by using DC magnetron sputtering. In this case, furrows were formed on the Cu film 69 as shown in FIG. 26 when the temperature of the silicon substrate 61 was raised to. e.c. 700° C. In this manner, a sample was fabricated. Subsequently, CMP was performed for the sample following the same procedures as in Example 6, thereby burying the Cu film 69 in the trenches 63, and removing the excess Cu film from projecting portions 66. Note that the polishing agent used was prepared by dispersing silica particles in an aqueous piperazine solution and mixing an oxidizing agent in the resultant dispersion.

After the CMP, the resultant sample was subjected to washing with pure water., scrubbing using a PVA fabric, and ultrasonic cleaning. The residual polishing particles on the sample were checked by using a dust checker and an SEM. As a result, as shown in FIG. 27A, no polishing particles 67 were present on the polycrystalline silicon film 68 on the projecting portions 66, and a slight amount of the polishing particles 67 was found on the Cu film 68 buried in the trenches 63. Plasma etching using a $CF_4$ plasma was then performed for the sample to remove the polycrystalline silicon film 68 formed on the projecting portions 66. FIG. 27B shows the section of the sample after the plasma etching. As shown in FIG. 27B, the surface of the $SiO_2$ film 62 was on almost the same level as the surface of the Cu film 69.

Subsequently, the resultant sample was subjected to washing with pure water, scrubbing using a PVA fabric, and ultrasonic cleaning, thereby removing the polishing particles 67 remaining on the Cu film 69. In this state, the residual polishing particles on the sample were checked by using the dust checker and the SEM. Consequently, as shown in FIG. 27C, the residual polishing particles 67 on the Cu film 69 were nearly completely removed. In addition, neither flaws nor dishing took place on the surface of the Cu film 69 buried in the trenches 63.

In each of Examples 6 to 8 described above, the slurry prepared by dispersing silica particles in an aqueous pH 11 piperazine solution was used as the polishing agent. However, it is also possible to use amines such as triethylamine, choline, and TMAH (tetramethylammoniumhydroxide), ammonia, or alkali hydroxide, as the alkali solution for adjusting the pH.

(Example 9)

As shown in FIG. 28, an $SiO_2$ film 62 was formed on a silicon substrate 61, and a 4,000-Å Al film 65 and a 500-Å carbon film 64 were formed in this order on the film 62 by DC magnetron sputtering. Subsequently, a pattern having a line width of 0.4 to 10 μm was formed by regular photolithography and etching processes. Thereafter, a 10,000-Å thick $SiO_2$ film 70 was formed on the entire surface by a plasma CVD process using organic silane gas. In this manner, a sample was fabricated. Subsequently, CMP was performed for the resultant sample following the same procedures as in Example 6, thereby removing the $SiO_2$ film 70 to the position of the upper surface of the Al film 65. As the polishing agent, a pH 10.0 slurry prepared by dispersing silica particles with a particle size of 500 Å in an aqueous potassium hydroxide solution was used. The polishing velocity $V_{OX}$ of the $SiO_2$ film and the polishing velocity $V_C$ of the carbon film were 1,000 and 10 Å/min, respectively, indicating a satisfactory polishing selectivity.

After the CMP, the resultant sample was subjected to washing with pure water, scrubbing using a PVA fabric, and ultrasonic cleaning. The remaining polishing particles on the sample were checked by using a dust checker and an SEM. As a result, as shown in FIG. 29A, a slight amount of polishing particles 67 was found on the $SiO_2$ film 70. Subsequently, an incineration treatment was performed for the sample following the same procedures as in Example 6, removing the carbon film 64 formed on the Al film 65. FIG. 29B shows the section of the sample after the incineration treatment. As shown in FIG. 29B, the surface of the exposed $SiO_2$ film 62 was nearly leveled with the surface of the Al film 65.

The resultant sample was then subjected to washing with pure water, scrubbing using a PVA fabric, and ultrasonic cleaning, thereby removing the polishing particles 67 left behind on the $SiO_2$ film 70. In this state, the residual polishing particles on the sample were checked by using the dust checker and the SEM. The result was, as shown in FIG. 29C, that the residual polishing particles 67 on the $SiO_2$ film 70 were removed almost completely. It was also found that the dishing amount was reduced within the thickness of the polishing-resistant film. That is, it was confirmed that identical effects could be obtained even if the film to be polished was not a metal film.

According to the polishing method of this embodiment as has been described above, a polishing-resistant film consisting of a material with a polishing velocity lower than that of the material of a film to be polished is formed on at least a projecting portion of a substrate having the projecting portion and a recessed portion. The film to be polished is formed on this polishing-resistant film and polished by using a polishing agent containing polishing particles with a particle size smaller than the thickness of the polishing-resistant film. This makes it possible to reduce dishing and to satisfactorily remove residual polishing particles after the polishing. Consequently, planarization of films and formation of buried metal interconnections can be performed well. This also facilitates removal of the polishing particles left behind on she surface of the film to be polished after the polishing.

Furthermore, the polishing amount can be controlled by appropriately setting the combination of the polishing-resistant film and the film to be polished or the combination of the thickness of the polishing-resistant film and the particle size of the polishing particles. This makes the fabrication of semiconductor devices with a high reliability possible.

Embodiment 4

Although $SiO_2$, Al, Cu, and W, for example, can be used as the material of an object to be polished by CMP in a semiconductor fabrication process, the polishing temperature is of greatest importance among other polishing conditions regardless of the material to be polished. That is, a change in the temperature of the CMP results in large changes in the polishing velocity and the polishing characteristics. Conventional polishing apparatuses use polishing temperature adjusting means in order to reduce variations in the polishing velocity and the polishing characteristics caused by a variation in the polishing temperature. For example, a cooling water circulating unit is connected to a vessel for storing a polishing agent to hold the temperature of the vessel constant, thereby preventing variations in the polishing characteristics caused by a temperature change. Alternatively, a cooling water circulating unit is connected to a turntable to cool it, thereby keeping the flatness of the turntable by preventing its warpage. An example of the polishing apparatus having means of this sort is Mecapol E2000 (tradename: manufactured by PRESSI CORP. (France)). This polishing apparatus includes means for cooling a turntable by spraying cooling water against the lower surface of the table.

The present inventors have made extensive studies and found that in performing CMP for the purpose of forming buried interconnections consisting of a soft metal such as Al, Cu, or Ag, if a polishing agent slurry is supplied at a low temperature of about 0° to 10° C., the resulting dishing of the metal is smaller than that when the polishing agent slurry is supplied at a room temperature of 20° to 30° C. If, however, a polishing agent prepared by dispersing polishing particles is kept at low temperatures in a tank for storing the polishing agent, the polishing particles readily flocculate and precipitate. If a polishing agent in which polishing particles flocculate and precipitate, i.e., an inhomogeneous polishing agent is used to perform polishing, flaws are formed on the surface of an object to be polished, or the polishing velocity or the polishing characteristics vary. Conventional polishing apparatuses include an agitator in a tank in order to prevent the flocculation and precipitation of polishing particles contained in a polishing agent. However, if the polishing agent is kept at low temperatures, the flocculation and precipitation of the polishing particles cannot be satisfactorily prevented by the agitator alone. Consequently, it is impossible to avoid the occurrence of flaws on the surface of an object to be polished or the variations in the polishing velocity and the polishing characteristics.

This embodiment, therefore, provides a polishing method of polishing an object to be polished while adjusting the temperature of a polishing agent to be supplied to a turntable, by using a polishing apparatus comprising a polishing agent storage vessel for storing the polishing agent, the turntable for polishing the object to be polished, a polishing agent supply pipe for supplying the polishing agent from the polishing agent storage vessel onto the turntable, a polishing object holding jig for holding the object to be polished such that the surface to be polished of the object opposes the turntable, and a polishing agent supply pipe temperature adjusting means for adjusting the temperature of the polishing agent.

(Example 9)

FIG. 30 is a schematic view showing one example of a polishing apparatus according to Embodiment 4. In FIG. 30, reference numeral 81 denotes a sample holder. This sample holder 81 is connected to a driving mechanism (not shown) and can be vertically moved and rotated by the driving mechanism. An object 82 to be polished is vacuum-chucked on the sample holder 81. A polishing table 84 is arranged below the sample holder 81. A polishing pad 83 is adhered to the upper surface of the polishing table 84. The polishing table 84 and the polishing pad 83 constitute a turntable. This turntable can be rotated by a driving mechanism (not shown).

A pipe 85 is disposed in the polishing table 84 and connected to a table temperature adjusting unit 86. A medium such as water is circulated through the pipe 85. The table temperature adjusting unit 86 incorporates a refrigerator and a heater ,neither is shown) and adjusts the temperature of the medium circulating through the pipe 85. Consequently, the temperature of the turntable is adjusted.

A 50-l polishing agent storage tank 87 for storing a polishing agent is arranged at a position above the turntable. A propeller 88 for agitating the polishing agent is placed inside the tank 87. A polishing agent supply pipe 89 is connected to the side wall of the polishing agent storage tank 87. A polishing agent temperature adjusting unit 92 is connected to the pipe 89. This unit 92 includes a refrigerator (not shown). When a polishing agent 91 flows through the polishing agent supply pipe 89, the temperature of the polishing agent 91 is adjusted before the agent is supplied onto the polishing pad 83. A pipe 93 is wound around the polishing agent storage tank 87 and connected to a tank temperature adjusting unit 94. A medium such as water is circulated through this pipe 93. The tank temperature adjusting unit 94 incorporates a refrigerator and a heater (neither is shown) and adjusts the temperature of the medium circulating through the pipe 93. Consequently, the temperature of the polishing agent storage tank 87 is adjusted. Note that the polishing agent temperature adjusting unit 92 and the tank temperature adjusting unit 94 can be controlled either independently of each other or simultaneously. In this manner, the polishing apparatus according to the present invention is arranged.

In actually polishing an object to be polished by using the polishing apparatus with the above arrangement, the sample holder 81 and the turntable are rotated by their respective driving mechanisms. The sample holder 81 is then moved downward to urge the object 82 to be polished against the polishing pad 83 with a predetermined load. In this state, polishing is performed by supplying the polishing agent 91 from an injection port 90 of the polishing agent supply pipe 89 onto the polishing pad 83.

A method of forming Al buried interconnections on a semiconductor substrate by using the above polishing apparatus will be described below.

First, an $SiO_2$ film 100 was formed on a silicon substrate, and a 50-nm thick carbon film 101 was formed on the entire surface of the $SiO_2$ film 100 by DC magnetron sputtering. Subsequently, trenches (1, 3, 5 and 10 μm in width) for forming interconnections were formed through a normal photolithography process. Thereafter, an Al film 102 was formed on the entire surface by using the DC magnetron sputtering. In this case, the Al film 102 was so formed as to have a thickness of 450 nm which was larger than the height of the trench steps. In this manner, the object 82 to be polished was manufactured.

The resultant object 82 was placed on the sample holder 81 and subjected to CMP. As the polishing pad 83, a material formed by adhering a foam polyurethane layer on an unwoven fabric and having a total thickness of 1.5 mm and a Shore hardness of 66 to 88 was used. This polishing pad was chosen because, when CMP was performed for soft metals, such as Al and Cu, at a polishing pressure of 30 to 600 $gf/cm^2$ by using only pure water, no flaws with a depth of 100 nm or more were formed on the polished surface regardless of the hardness and the polishing pressure. As the polishing agent 91, a material prepared by dispersing 1.0 wt % of silica particles with a mean particle size of 35 nm in pure water was used. The polishing conditions were set as follows. Note that the turntable temperature was kept constant by the table temperature adjusting unit 86.

Polishing pressure: 300 $gf/cm^2$

Turntable temperature: 25° C. (room temperature)

Polishing table rotating speed: 100 rpm

Sample holder rotating speed: 100 rpm

Under the above polishing conditions, the temperature of the polishing agent to be supplied was changed under the following conditions (1) and (2).

Condition (1)

The polishing agent 91 was supplied to the polishing agent storage tank 87 to 25° C. (room temperature), and the temperature of the polishing agent storage tank 87 was adjusted to 25° C by the tank temperature adjusting unit 94. During the adjustment, the polishing agent 91 stored in the polishing agent storage tank 87 was agitated by the propeller 88. In supplying the polishing agent 91 onto the polishing pad 83 through the polishing agent supply pipe 89, the temperature of the polishing agent 91 was varied between 1 and 80° C. by the polishing agent temperature adjusting unit 92.

Condition (2)

The polishing agent 91 was supplied to the polishing agent storage tank 87 at 25° C. (room temperature), and the temperature of the polishing agent storage tank 87 was changed between 1° and 80° C. by the tank temperature adjusting unit 94 while the polishing agent 91 stored in the polishing agent storage tank 87 was agitated by the propeller 88. When the temperature of the polishing agent 91 in the polishing agent storage tank 87 was stabilized, the polishing agent 91 was supplied onto the polishing pad 83 through the polishing agent supply pipe 89. At this time, the polishing agent temperature adjusting unit 92 was removed.

FIGS. 32 and 33 are graphs showing the relationship between the dishing amount of the Al interconnection and the polishing agent temperature and the relationship between the maximum surface roughness $R_{max}$ on the Al surface and the polishing agent temperature, respectively, when the object to be polished shown in FIG. 31 was polished under the conditions (1) and (2). Note that it was difficult to directly measure the temperature of the polishing agent to be supplied to the polishing pad 83, so the temperature (polishing surface temperature) on the surface of the polishing pad 83 was measured instead of the polishing agent temperature.

As can be seen from FIG. 32, the values of the dishing amount under the condition (1), i.e., when the temperature adjustment was performed by using the polishing agent supply pipe 89 were almost the same as those under the condition (2), i.e., when the temperature adjustment was performed by using the polishing agent storage tank 87. More specifically, the dishing amount tends to decrease as the temperature of the polishing agent is lower. Therefore, the dishing amount of the object to be polished can be decreased by lowering the temperature of the polishing agent. In addition, as is apparent from FIG. 33, when the polishing agent temperature is low, the maximum surface roughness $R_{max}$ on the Al surface after the polishing is decreased by performing the temperature adjustment through the polishing agent supply pipe 89.

Generally, in a material such as a polishing agent in which polishing particles as fine particles are dispersed in a solution, if the particles are sufficiently small, the dispersed state is maintained by Brownian movement or by repulsions between the particles caused by electric charges stored on the surfaces. However, if the particles are large or the energy for Brownian movement is insufficient because of a low temperature, the particles flocculate and precipitate. For this reason, if the polishing agent storage tank 87 is cooled, the energy for Brownian movement becomes insufficient even under agitation, so the polishing particles flocculate and precipitate. As a result, the maximum surface roughness $R_{max}$ on the Al surface after the polishing increases. If the polishing agent supply pipe 89 is cooled, on the other hand, the polishing agent 91 is kept dispersed in the polishing agent storage tank 87. In addition, since the polishing agent is cooled immediately before being supplied onto the polishing pad 83, neither flocculation nor precipitation of the polishing particles takes place. Consequently, the maximum surface roughness $R_{max}$ on the Al surface after the polishing is small.

The following experiment was conducted to confirm the above assumption. To begin with, the polishing agent 91 was supplied to the polishing agent storage tank 87 at 25° C. (room temperature) and agitated by the propeller 88. The set temperature of the polishing agent temperature adjusting unit 92 was set at 5° C. In this state, the polishing agent 91 was supplied onto the polishing pad 83 through the polishing agent supply pipe 89. The result was that the polishing agent temperature at the injection port 90 was 5±0.5° C. at any instant. When the polishing agent 91 injected from the injection port 90 was examined, it was found that neither flocculation nor precipitation occurred. Subsequently, the polishing agent 91 was supplied to the polishing agent storage tank 87 at 25° C. (room temperature) and agitated by the propeller 88. The set temperature of the rank temperature adjusting unit 94 was set at 5° C. In this state, the polishing agent 91 was supplied onto the polishing pad 83 through the polishing agent supply pipe 89. Consequently, the polishing agent temperature at the injection port 90 was found to be 5±0.5° C. at any instant as in the above case. When the polishing agent 91 injected from the injection port 90 was checked, however, a gel precipitate of silica was contained in an amount of 1 cc per liter.

From the above experiment, it is found that if the polishing agent 91 is set at a low temperature in the polishing agent storage tank 87, it is not possible to completely prevent flocculation and precipitation of the polishing particles by the agitation of the propeller 88 alone. That is, as a time period during which the polishing agent 91 is held at a low temperature is prolonged, flocculation and precipitation of the polishing particles become more likely to occur. The polishing particles with a large particle size thus flocculated cause flaws on the surface of the object to be polished. Therefore, to supply the polishing agent at a low temperature and in a stable dispersed state, it is most preferable that the polishing agent 91 be kept at a temperature at which neither flocculation nor precipitation of the polishing particles occurs in the polishing agent storage tank 87, and be cooled in the polishing agent supply pipe 89 immediately before being supplied to the turntable. Note that in order to cool the polishing agent 91 immediately before it is supplied to the turntable, it is possible to perform a method by which the polishing agent 91 kept at a temperature at which neither flocculation nor precipitation of the polishing particles occurs is supplied to a cooled turntable. In this method, however, the polishing agent constantly flows during polishing, and the thermal conductivity of the polishing pad on the turntable is low. Therefore, the method is considered to be impractical when these facts are taken into account.

Although the Al film is used as the object to be polished in Example 9, this Al may contain a small amount of an impurity. For example, the above effects can be accomplished even by using a film composed of an Al alloy containing 1.0 wt % of Si or 1.0 wt % of Cu as an object to be polished. In addition, in Example 9, the material prepared by dispersing 1.0 wt % of silica particles with a mean particle size of 35 nm in pure water is used as the polishing agent for Al. However, the above effects can be achieved by using other polishing agents. Furthermore, it is also possible to achieve the above effects without using the polishing agent temperature adjusting unit or the tank temperature adjusting unit as shown in FIG. 30, provided that the polishing agent 91 can be cooled immediately before being supplied onto the polishing pad 83.

(Example 10)

FIG. 34 is a sectional view showing another example of the object to be polished by CMP by using the polishing apparatus shown in FIG. 30. First, an $SiO_2$ film 100 was formed on a silicon substrate, and trenches (1, 3, 5, and 10 μm in width) for forming interconnections were formed on the $SiO_2$ film 103 through a normal photolithography process. Subsequently, a 50-nm thick titanium nitride film 103 was formed on the entire surface by DC magnetron sputtering. Thereafter, a Cu film 104 was formed on the entire surface by using the DC magnetron sputtering. In this case, the Cu film 104 was so formed as to have a thickness of 450 nm which was larger than the height of the trench steps. In this manner, the object 82 to be polished was manufactured.

The resultant object 82 was placed on the sample holder 81 and subjected to CMP. As the polishing pad 83, a material formed by adhering a foam polyurethane layer on an unwoven fabric and having a total thickness of 1.5 mm and a Shore hardness of 66 to 88 was used. As a polishing agent 91, a material prepared by dispersing 10 wt % of silica particles with a mean particle size of 35 nm in pure water was used.

The polishing conditions were set as follows. Note that the turntable temperature was kept constant by the table temperature adjusting unit 86.

Polishing pressure:300 gf/cm$^2$

Turntable temperature:25° C. (room temperature)

Polishing table rotating speed:100 rpm

Sample holder rotating speed:100 rpm

Under the above polishing conditions, the temperature of the polishing agent to be supplied was changed under the conditions (1) and (2) in Example 9. FIGS. 35 and 36 are graphs showing the relationship between the dishing amount of the Cu interconnection and the polishing agent temperature and the relationship between the maximum surface roughness $R_{max}$ on the Cu surface and the polishing agent temperature, respectively.

As can be seen from FIG. 35, the values of the dishing amount under the condition (1) were almost the same as those under the condition (2). More specifically, the dishing amount tends to decrease as the temperature of the polishing agent is lower. Therefore, the dishing amount of the object to be polished can be decreased by lowering the temperature of the polishing agent. In addition, as is apparent from FIG. 36, when the polishing agent temperature is low, the maximum surface roughness $R_{max}$ on the Cu surface after the polishing is decreased by performing the temperature adjustment by using the polishing agent supply pipe 89.

Although the Cu film is used as the object to be polished in Practical Example 10, the above effects can be accomplished even if this Cu contains a small amount of an impurity. In addition, in Example 10, the material prepared by dispersing 10 wt % of silica particles with a mean particle size of 35 nm in pure water is used as the polishing agent for Cu. However, the above effects can be achieved by using other polishing agents.

In Examples 9 and 10, the material formed by adhering a foam polyurethane layer on an unwoven fabric is used as the polishing pad. It is also possible to achieve the above effects by using any of a polishing pad consisting of an unwoven fabric, such as polyester or polyether, a polishing pad formed by performing a resin impregnation treatment for the unwoven fabric of this sort, and a polishing pad formed by adhering two or more different types of pads, as long as the polishing pad has a hardness equivalent to that of the polishing pad used in the above examples.

(Example 11)

FIG. 37 is a schematic view showing another example of the polishing apparatus according to Embodiment 4. The same reference numerals as in FIG. 30 denote the same parts in FIG. 37, and a detailed description thereof will be omitted. As liquid feed pump 111 is connected to a portion of a polishing agent supply pipe 89 between a polishing agent temperature adjusting unit 92 and a polishing agent storage tank 87. A pipe 110 for returning a polishing agent 91 to the polishing agent storage tank 87 is connected to another portion of the polishing agent supply pipe 89 between the polishing agent temperature adjusting unit 92 and an injection port 90. When a time period which is from one polishing to the next and during which no polishing is performed is long, if the set temperature of the polishing agent temperature adjusting unit 92 is low, the polishing agent 91 remaining in the polishing agent temperature adjusting unit 92 of the polishing agent supply pipe 89 may flocculate and precipitate. Therefore, valves $V_1$, and $V_2$ for performing switching by which the polishing agent 91 is either supplied to a polishing pad 83 or returned to the polishing agent storage tank 87 are preferably arranged downstream of the polishing agent temperature adjusting unit 92.

In actually polishing an object to be polished in the polishing apparatus with the above arrangement, driving mechanisms rotate a sample holder 81 and a turntable. The sample holder 81 is moved downward to urge an object 82 to be polished against the polishing pad 83 with a predetermined load. In this state, polishing is performed by supplying the polishing agent 91 from the injection port 90 of the polishing agent supply pipe 89 onto the polishing pad 83. When no polishing is to be performed, to avoid variations in the polishing characteristics caused by inhomogeneity of the polishing agent 91 or by variations in the liquid feed rate, the liquid feed pump 111 is activated, and the valves $V_1$, and $V_2$ are operated to return the polishing agent 91 to the polishing agent storage tank 87.

To form Al buried interconnections on a semiconductor substrate, the above polishing apparatus was used to perform CMP for the object to be polished illustrated in FIG. 31. Consequently, results similar to those in Example 9 were obtained.

(Example 12)

The object to be polished shown in FIG. 31 was placed on the sample holder 81 of the polishing apparatus shown an FIG. 30, and CMP was performed for the object. As the polishing pad 83, a material formed by adhering a foam polyurethane layer on an unwoven fabric and having a total thickness of 1.5 mm and a Shore hardness of 66 to 88 was used. As the polishing agent 91, a material prepared by dispersing 10 wt % of silica particles with a mean particle size of 30 nm in an aqueous alkaline amine solution was used. The polishing conditions were set as follows. Note that the turntable temperature was kept constant by the table temperature adjusting unit 86.

Polishing pressure:300 gf/cm²

Turntable temperature:25° C. (room temperature)

Polishing table rotating speed:100 rpm

Sample holder rotating speed:100 rpm

Under the above polishing conditions, the temperature of the polishing agent to be supplied was changed as follows. That is, the polishing agent 91 was supplied to the polishing agent storage tank 87 at 25° C. (room temperature), and the temperature of the polishing agent storage tank 87 was adjusted to 25° C. by the tank temperature adjusting unit 94. The polishing agent 91 stored in the polishing agent storage tank 87 was agitated by the propeller 88. In supplying the polishing agent 91 onto the polishing pad 83 through the polishing agent supply pipe 89, the temperature of the polishing agent 91 was changed between −1° and 80° C. by the polishing agent temperature adjusting unit 92.

FIGS. 38 and 39 are graphs showing the relationship between the dishing amount of the Al interconnection and the polishing agent temperature and the relationship between the maximum surface roughness $R_{max}$ on the Al surface and the polishing agent temperature, respectively, when the object to be polished illustrated in FIG. 31 was polished under the above conditions.

As is apparent from FIG. 38, as the temperature of the polishing agent is lower, the dishing amount tends to decrease. Therefore, the dishing amount of the object to be polished can be decreased by lowering the temperature of the polishing agent. This effect was remarkable when a polishing agent having the nature of a colloid was used. Such a colloidal fluid generally exhibits a property termed dilatancy in which an apparent viscosity coefficient does not follow the Newton's law of viscosity but increases with increasing shearing stress. It is assumed that by this dilatancy, the polishing particles held by a liquid apparently in the form of a gel mechanically remove the object to be polished in units of micro dimensions. Therefore, it is considered that the largest cause of the effect of discouraging dishing by decreasing the temperature of the polishing agent as in this embodiment is that the above-mentioned polishing mechanism has a temperature dependence, and this emphasizes the dilatancy at low temperatures.

Generally, when RC delay in interconnections of an LSI is taken into account, a decrease in the sectional area of an interconnection caused by dishing must be reduced to about 10%. For this reason, the temperature range of a suitable polishing agent changes in accordance with the thickness or shape of an interconnection of interest. For example, in forming a buried interconnection 0.4 μm thick and 0.4 to 10 μm wide by using a 50-nm thick polishing-resistant film, the dishing amount must be about 130 nm or smaller. Therefore, it is apparent from FIG. 38 that the temperature of the polishing agent must be decreased to 15° C. or lower. In addition, as shown in FIG. 38, dishing can be further discouraged by setting the temperature of the polishing agent close to the freezing point, i.e., −1° to 5° C.

FIG. 39 shows that when the polishing agent of the above sort was used, the maximum surface roughness $R_{max}$ on the Al surface after the polishing was kept at a value at which no problem arose in reliability of the interconnections, regardless of the temperature of the polishing agent.

In Example 12, Al may contain a small amount of an impurity. For example, the above effects can be achieved by using a film consisting of an Al alloy containing 1.0 wt % of Si or 1.0 wt % of Cu as the object to be polished. In addition, although the polishing agent containing only silica particles as polishing particles is used in Practical Example 12, it is also possible to use a polishing agent containing silica particles and particles of another substance as polishing particles. In this case, it is preferable that the pH of the polishing agent be 7.5 or more and the particle size of the polishing particles be 100 nm or less.

(Example 13)

The object to be polished shown in FIG. 34 was placed on the sample holder 81 of the polishing apparatus shown in FIG. 30, and CMP was performed for the object. As the polishing pad 83, a material formed by adhering a foam polyurethane layer on an unwoven fabric and having a total thickness of 1.5 mm and a Shore hardness of 66 to 88 was used. As the polishing agent 91, a material prepared by dispersing 20 wt % of silica particles with a mean particle size of 30 nm in hydrogen peroxide water added with an oxidizing agent was used. The polishing conditions were set as follows. Note that the turntable temperature was kept constant by a table temperature adjusting unit 86.

Polishing pressure: 300 gf/cm$^2$

Turntable temperature: 25° C. (room temperature)

Polishing table rotating speed: 100 rpm

Sample holder rotating speed: 100 rpm

FIGS. 40 and 41 are graphs showing the relationship between the dishing amount of the Cu interconnection and the polishing agent temperature and the relationship between the maximum surface roughness $R_{max}$ on the Cu surface and the polishing agent temperature, respectively. As is apparent from FIG. 40, as the temperature of the polishing agent is lower, the dishing amount tends to decrease. Therefore, the dishing amount of the object to be polished can be decreased by lowering the temperature of the polishing agent. This effect appears when the polishing agent has the nature of a colloid. In addition, FIG. 41 shows that, as in Example 12 described above, when the polishing agent of the above sort was used, the maximum surface roughness $R_{max}$ on the Al surface after the polishing was kept at a value at which no problem arose in reliability of the interconnections, regardless of the temperature of the polishing agent.

In Example 13, the Cu film is used as the object to be polished. However, the above effects can be accomplished even when Cu contains a small amount of an impurity. In addition, in Examples 12 and 13, the material formed by adhering a foam polyurethane layer on an unwoven fabric is used as he polishing pad. It is also possible to achieve the above effects by using any of a polishing pad consisting of an unwoven fabric, such as polyester or polyether, a polishing pad formed by performing a resin impregnation treatment for the unwoven fabric of his sort, and a polishing pad formed by adhering two or more different types or pads, as long as the polishing pad has a hardness equivalent to that of the polishing pad used in the above examples.

Embodiment 5

In the fifth embodiment, a volume of the wiring metal to be filled into the groove is minimized and a uniformly filled wiring is realized by using a wettability improved layer.

FIGS. 42A–42D shows cross sectional views for making a semiconductor device according to the fifth embodiment.

A single-crystal Si (100) 121 is used for a substrate. In the fifth embodiment, with reference to FIG. 42A, a thermal oxide film 122 of 1 µm thickness was grown on the Si substrate 11, and on the thermal oxide film there is formed a wiring pattern groove 123 whose depth and width are 0.4 µm and 0.6 µm, respectively, by a photo-lithography and a reactive ion etching (RIE).

In the RIE, there is preferably used a mixture gas of $CF_4$ and $H_2$ and each gas is preferably supplied at a flow rate of 16 SCCM and 24 SCCM, respectively. A pressure at the time of the etching is preferably controlled at 40 mTorr, and an applied power at the time of the etching is preferably 800 W. Thereafter, a residual resist is removed in an atmosphere of oxygen plasma. Thereafter, cleansing is carried out in mixture liquid of sulfuric acid and hydrogen peroxide water.

Next, with reference to FIG. 42B, a C (carbon) film 124 is formed on the thermal oxide film 122 by the magnetron sputtering. Then, the thickness of the C film was varied at 0.02 µm, 0.05 µm, 0.1 µm and 0.2 µm. Ar gas was utilized in the sputtering, a background (vacuum) pressure was less than $10^{-8}$ Torr, a pressure under sputtering was $3 \times 10^{-3}$ Torr, and an applied power was 4 KW.

Next, with reference to FIG. 42C, an Al thin film was formed on the C film 124 sequentially by the d.c. magnetron sputtering technique at the thickness of 0.1 µm through 0.8 µm without annealing thereon. Then Al with purity 99.9999% was used for a sputtering target. Ar was the gas that was utilized in the sputtering, the background pressure was less than $10^{-8}$ Torr, the pressure during the sputtering was $3 \times 10^{-3}$ Torr, and the applied power was 6 KW, so as to form the Al film while suppressing the formation of the native oxide film on the Al surface.

Next, with reference to FIGS. 42C and 42D, the above device was annealed using a halogen lamp from a back side of the substrate under the same vacuum background as in the sputtering for duration of 45 seconds. In other words, the device was in-situ annealed so that Al 125 is filled in the groove as a result of agglomeration. The arriving temperature as varied from 300° C. through 660° C.

Thereafter, Al which was left behind in a wide-range region where a wiring pattern was not formed was removed by a chemical mechanical polishing technique. Polishing grains were colloidal silica (fine $SiO_2$ particles) whose average grain diameter is 35 nm and which was used in an alkaline aqueous solution so as to avoid the adsorption between the particles. Most of C film 124 can not be polished by the polishing particles. Thus the polishing was stopped by the time when removal of the residual A1 in the flat portion was completed, so that the surface of the Al interconnection was not polished more than what is necessary. After polishing, still remaining C film 124 was removed in an $O_2$ plasma.

Moreover, in case where a conductive layer is exposed in the inner surface of the groove, the wettability improving layer may be formed on the substrate surface excluding the groove portion. This technique will be described in detail as follows.

First, there are formed a deposition layer of W 131 and Tin 132 as a lower electrode, on which there is formed a $SiO_2$ film 133 of 1.2 µm thickness by plasma CVD method. Thereafter, the contact hole 134 was formed by the photolithography and RIE in a manner that there remains the $SiO_2$, film with 0.4 µm. After a resist 135 was removed, the C film 136 serving as the wettability improving layer was formed at 0.02 µm by the d.c. magnetron sputtering technique.

Thereafter, there is formed a resist on the C film 136, and the patterning is performed on the resist in a manner that the wiring groove pattern is fit into the contact hole 134 which is etched half way using the photolithography again, as shown in FIG. 43A. Next, the etching is the C film 136 by the RIE using the oxygen ($O_2$), and the etching is carried out on the $SiO_2$ film 133 by as much as 0.4 µm by RIE using the mixture gas of $CF_4$ and $H_2$ continuously. By this etching, the surface of TiN which is an upper layer of the lower electrode is expose on the bottom face of the contact hole 137.

Thereafter, with reference to FIG., 43, the resist is removed by a down-flow etching with $CF_4$ and $O_2$ gases. Next, a pure Al film 138 is formed at 0.2 µm by the d.c. magnetron sputtering technique. Thereafter, the substrate is heated at 550° C. for 45 seconds without being exposed to the air and the Al film 138 is filled into the groove including the contact hole 137 by annealing as shown in FIG. 43C.

Moreover, the residual island-shaped Al remaining in the flat C film 136 excluding the groove was removed using a polishing technique. Silica ($SiO_2$) particles are dispersed into alkaline solution (piperazine $C_4H_{10}N_2$) solution) so as to form a colloidal silica. Using the polishing liquid, a polishing rate of the C film 136 is low (slow) so that the C film 136 serves as a stopper layer in polishing and the Al film 138 in the groove is not polished more than what is necessary. After the polishing is completed, the C film 136 which is the wettability improving layer as well as serves as the stopper layer is removed by the plasma process as shown in FIG. 43C.

Note that Embodiments 1 to 4 of the present invention can be carried out in the form of appropriate combinations with each other. In the above examples, polishing is performed by using Al, or Cu as an object to be polished. However, the present invention is effective when polishing is performed by using Ag, which is also a soft metal similar to Al, as an object to be polished. In addition, the present invention is effective even for a substrate on the surface of which trenches with different widths are formed. A substrate having trenches, which formed on a surface of an insulating film on a semiconductor substrate, for burying a wiring material, or a substrate (a phase shift mask, an X-ray mask) having trenches, which formed on transparent (insulating) substrate, for burying a light absorbing material (for a visible ray, an ultraviolet light or an X-ray) such as Cr, W may be used as above substrate. Other modifications of the present invention also can be made without departing from the gist of the invention.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A polishing apparatus comprising:

a polishing agent storage vessel for storing a polishing agent;

a turntable for polishing an object to be polished;

a polishing agent supply pipe for supplying said polishing agent from said polishing agent storage vessel onto said turntable;

a polishing object holding jig for holding said object to be polished such that a surface to be polished of said object opposes said turntable;

first temperature adjusting means for adjusting a temperature of said polishing agent in said polishing agent supply pipe; and second temperature adjusting means for adjusting a temperature of said polishing agent in said polishing agent storage vessel.

2. An apparatus according to claim 1, wherein said first temperature adjusting means is a temperature adjusting means for lowering a temperature of said polishing agent to a temperature lower than that of said polishing agent in said polishing agent storage vessel.

3. An apparatus according to claim 1, wherein said first temperature adjusting means and said second temperature adjusting means are controlled independently of each other.

4. An apparatus according to claim 1, further comprising third temperature adjusting means for adjusting a temperature of said turntable.

5. A polishing apparatus comprising:

a polishing agent storage vessel for storing a polishing agent;

a turntable for polishing an object to be polished;

a polishing agent supply pipe for supplying said polishing agent from said polishing agent storage vessel onto said turntable;

a polishing object holding jig for holding said object to be polished such that a surface to be polished of said object opposes said turntable;

first temperature adjusting means for adjusting a temperature of said polishing agent in said polishing agent storage vessal; and means for returning said polishing agent passing through said polishing agent supply pipe to said polishing agent storage vessel.

6. An apparatus according to claim 5, further comprising third temperature adjusting means for adjusting a temperature of said turntable.

7. An apparatus according to claim 5, further comprising second temperature adjusting means for adjusting a temperature of said polishing agent in said polishing agent supply pipe.

8. An apparatus according to claim 7, wherein said second temperature adjusting means is a temperature adjusting means for lowering a temperature of said polishing agent to a temperature lower than that of said polishing agent in said polishing agent storage vessel.

* * * * *